US012777799B2

(12) United States Patent
Yuan et al.

(10) Patent No.: US 12,777,799 B2
(45) Date of Patent: Oct. 27, 2026

(54) DISPLAY SUBSTRATE, PREPARATION METHOD THEREFOR, AND DISPLAY APPARATUS

(71) Applicants: Hefei BOE Joint Technology Co., Ltd., Hefei (CN); BOE Technology Group Co., Ltd., Beijing (CN)

(72) Inventors: Can Yuan, Beijing (CN); Yongqian Li, Beijing (CN); Zhidong Yuan, Beijing (CN); Luke Ding, Beijing (CN); Liu Wu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 383 days.

(21) Appl. No.: 18/694,960

(22) PCT Filed: Jul. 17, 2023

(86) PCT No.: PCT/CN2023/107719

§ 371 (c)(1),
(2) Date: Mar. 23, 2024

(87) PCT Pub. No.: WO2025/015498

PCT Pub. Date: Jan. 23, 2025

(65) Prior Publication Data

US 2025/0248244 A1 Jul. 31, 2025

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/1216* (2023.02); *H10K 59/80516* (2023.02)

(58) Field of Classification Search
CPC ............ H10K 59/131; H10K 59/1201; H10K 59/1216; H10K 59/80516; H10K 59/12;
(Continued)

(56) References Cited

U.S. PATENT DOCUMENTS 9,466,622 B2 10/2016 Shibata et al.
11,183,521 B2 11/2021 Lee et al.
(Continued)

FOREIGN PATENT DOCUMENTS

CN 104377230 A 2/2015
CN 108242457 A 7/2018
(Continued)

*Primary Examiner* — Mohammed R Alam

(57) ABSTRACT

Disclosed is a display substrate includes including multiple repetition units, wherein a repetition unit includes a display region and a light transmitting region. The display region includes multiple sub-pixels, a sub-pixel includes a pixel drive circuit and a light emitting device, the pixel drive circuit includes a first electrode plate, and the light emitting device includes a first electrode. The display substrate includes multiple conductive layers. The first electrode plate, an electrode plate connection electrode, and the first electrode are disposed in different conductive layers. The first electrode plate is connected with the electrode plate connection electrode through a first electrode plate via, the first electrode plate is connected with the electrode plate connection electrode through a second electrode plate via, and the second electrode plate via is disposed on a side of the first electrode plate via close to the light transmitting region.

20 Claims, 11 Drawing Sheets

(51) Int. Cl.
*H10K 59/121* (2023.01)
*H10K 59/80* (2023.01)

(58) Field of Classification Search
CPC ............. H10K 59/1213; H10K 59/123; H10K 2102/3031
See application file for complete search history.

(56) References Cited

U.S. PATENT DOCUMENTS

| | | | | |
|---|---|---|---|---|
| 2016/0300859 | A1 | 10/2016 | Moon et al. | |
| 2021/0202621 | A1* | 7/2021 | Liang | H10K 59/1213 |
| 2023/0148287 | A1* | 5/2023 | Liu | H10D 30/6723 257/71 |

FOREIGN PATENT DOCUMENTS

| | | | |
|---|---|---|---|
| CN | 107611163 | B | 7/2020 |
| CN | 112786667 | A | 5/2021 |
| CN | 113270422 | A | 8/2021 |
| CN | 113471268 | A | 10/2021 |
| CN | 110416278 | B | 9/2022 |
| CN | 114927553 | B | 11/2022 |
| CN | 115623880 | A | 1/2023 |
| WO | 2023019634 | A1 | 2/2023 |
| WO | 2023023979 | A1 | 3/2023 |

* cited by examiner

DISPLAY SUBSTRATE, PREPARATION METHOD THEREFOR, AND DISPLAY APPARATUS

CROSS-REFERENCE TO RELATED APPLICATION

The present application is a U.S. National Phase Entry of International Application No. PCT/CN2023/107719 having an international filing date of Jul. 17, 2023, contents of which should be regarded as being incorporated herein by reference.

TECHNICAL FIELD

The present disclosure relates to, but is not limited to, the field of display technologies, and in particular to a display substrate, a preparation method therefor, and a display apparatus.

BACKGROUND

An Organic Light Emitting Diode (OLED) is an active light emitting display device, which has advantages of active light emission, being ultrathin, a wide viewing angle, high brightness, high contrast, low power consumption, an extremely high reaction speed, lightness and thinness, ability of being special-shaped, and ability of flexible display, and it has gradually become a next generation display technology with great development prospects. An Active Matrix (AM) type OLED is a current-driven device, each sub-pixel is controlled by using an independent Thin Film Transistor (TFT), and each sub-pixel may be continuously and independently driven to emit light.

SUMMARY

The following is a summary of subject matters described herein in detail. The summary is not intended to limit the scope of protection of claims.

In one aspect, an embodiment of the present disclosure provides a display substrate. In an exemplary implementation mode, the display substrate includes multiple repetition units, at least one repetition unit includes a display region and a light transmitting region located on at least one side of the display region, the display region is configured to perform image display, and the light transmitting region is configured to transmit light. The display region includes multiple sub-pixels, at least one sub-pixel includes a pixel drive circuit and a light emitting device, the pixel drive circuit at least includes a storage capacitor, the storage capacitor at least includes a first electrode plate, the light emitting device at least includes a first electrode, and the first electrode is connected with the first electrode plate through an electrode plate connection electrode. In a direction perpendicular to the display substrate, the display substrate at least includes multiple conductive layers disposed on a base substrate, the first electrode plate, the electrode plate connection electrode, and the first electrode are disposed in different conductive layers, the first electrode plate is connected with the electrode plate connection electrode through a first electrode plate via, the first electrode is connected with the electrode plate connection electrode through a second electrode plate via, and in at least one sub-pixel, the second electrode plate via is disposed on a side of the first electrode plate via close to the light transmitting region.

In an exemplary implementation mode, the display region further includes a first power supply line, the first power supply line is configured to supply a first power supply signal to the pixel drive circuit, and the first power supply line is disposed on a side of the display region close to the light transmitting region. The first electrode plate via is disposed on a side of the first power supply line away from the light transmitting region, the second electrode plate via is disposed on a side of the first power supply line close to the light transmitting region, and an orthographic projection of the electrode plate connection electrode on the base substrate is at least partially overlapped with an orthographic projection of the first power supply line on the base substrate.

In an exemplary implementation mode, the display region further includes a second power supply line, the second power supply line is configured to supply a second power supply signal to the light emitting device, and the second power supply line is disposed on a side of the display region close to the light transmitting region. The first electrode plate via is disposed on a side of the second power supply line away from the light transmitting region, the second electrode plate via is disposed on a side of the second power supply line close to the light transmitting region, and an orthographic projection of the electrode plate connection electrode on the base substrate is at least partially overlapped with an orthographic projection of the second power supply line on the base substrate.

In an exemplary implementation mode, the light transmitting region further includes at least one first auxiliary electrode and at least one second auxiliary electrode, the second auxiliary electrode is connected with the first auxiliary electrode through an auxiliary electrode via, and the first auxiliary electrode is connected with the second power supply line. There is a first distance between an edge of the second electrode plate via away from the second power supply line and an edge of the second power supply line close to the second electrode plate via, and there is a second distance between an edge of at least one auxiliary electrode via away from the second power supply line and an edge of the second power supply line close to the auxiliary electrode via, and the first distance is smaller than the second distance.

In an exemplary implementation mode, an area of an orthographic projection of the auxiliary electrode via on the base substrate is larger than an area of an orthographic projection of the second electrode plate via on the base substrate.

In an exemplary implementation mode, an area of an orthographic projection of the second electrode plate via on the base substrate is larger than an area of an orthographic projection of the first electrode plate via on the base substrate.

In an exemplary implementation mode, the multiple conductive layers at least include a first conductive layer disposed on the base substrate, a second conductive layer disposed on a side of the first conductive layer away from the base substrate, and a third conductive layer disposed on a side of the second conductive layer away from the base substrate. The first electrode plate is disposed in the first conductive layer, the electrode plate connection electrode is disposed in the second conductive layer, and the first electrode is disposed in the third conductive layer.

In an exemplary implementation mode, the display substrate further includes a first insulation layer, a second insulation layer, and a third insulation layer. The first insulation layer is disposed on a side of the first conductive layer away from the base substrate; the second insulation layer is disposed on a side of the first insulation layer away from the base substrate, and the second conductive layer is disposed on a side of the second insulation layer away from the base substrate; and the third insulation layer is disposed on a side of the second conductive layer away from the base substrate, and the third conductive layer is disposed on a side of the third insulation layer away from the base substrate. The first electrode plate via is disposed in the first insulation layer and the second insulation layer, and the second electrode plate via is disposed in the third insulation layer.

In an exemplary implementation mode, in at least one sub-pixel, the storage capacitor further includes a second electrode plate, an orthographic projection of the second electrode plate on the base substrate is at least partially overlapped with an orthographic projection of the first electrode plate on the base substrate, and the second electrode plate is disposed in a same layer as the electrode plate connection electrode.

In an exemplary implementation mode, in at least one sub-pixel, an electrode plate groove is disposed on the second electrode plate, and an orthographic projection of the first electrode plate via on the base substrate is within a range of an orthographic projection of the electrode plate groove on the base substrate.

In an exemplary implementation mode, in at least one sub-pixel, the electrode plate connection electrode at least includes a first sub-connection electrode and a second sub-connection electrode. A first end of the first sub-connection electrode is connected with the first electrode plate through the first electrode plate via, a second end of the first sub-connection electrode is connected with the second sub-connection electrode after extending toward a direction close to the light transmitting region, and the first electrode is connected with the second sub-connection electrode through the second electrode plate via.

In an exemplary implementation mode, in at least one sub-pixel, the first sub-connection electrode and the second sub-connection electrode are disposed in a same layer and are of an interconnected integral structure.

In an exemplary implementation mode, in at least one sub-pixel, the first electrode at least includes a first sub-electrode, a second sub-electrode, and a sub-connection electrode. The first sub-electrode and the second sub-electrode are disposed in isolation, the sub-connection electrode has a "C" shape, a first end of the sub-connection electrode is connected with the first sub-electrode, a second end of the sub-connection electrode is connected with the second sub-electrode, and a region between the first end and the second end is connected with the electrode plate connection electrode through the second electrode plate via.

In an exemplary implementation mode, in at least one sub-pixel, the first sub-electrode, the second sub-electrode, and the sub-connection electrode are disposed in a same layer and are of an interconnected integral structure.

In an exemplary implementation mode, in at least one sub-pixel, an orthographic projection of the first sub-electrode on the base substrate is not overlapped with an orthographic projection of the first electrode plate via on the base substrate, and an orthographic projection of the second sub-electrode on the base substrate is not overlapped with the orthographic projection of the first electrode plate via on the base substrate.

In an exemplary implementation mode, in at least one sub-pixel, the display region further includes a second electrode disposed on a side of the first electrode away from the base substrate, the second electrode includes a third sub-electrode and a fourth sub-electrode disposed in isolation, an orthographic projection of the third sub-electrode on the base substrate is at least partially overlapped with an orthographic projection of the first sub-electrode on the base substrate, the third sub-electrode is lapped with the first sub-electrode, an orthographic projection of the fourth sub-electrode on the base substrate is at least partially overlapped with an orthographic projection of the second sub-electrode on the base substrate, the fourth sub-electrode is lapped with the second sub-electrode, the orthographic projection of the third sub-electrode on the base substrate is not overlapped with the orthographic projection of the first electrode plate via on the base substrate, and the orthographic projection of the fourth sub-electrode on the base substrate is not overlapped with the orthographic projection of the first electrode plate via on the base substrate.

In an exemplary implementation mode, the display substrate further includes a pixel definition layer disposed on a side of the second electrode away from the base substrate. In at least one sub-pixel, the pixel definition layer is provided with a first pixel opening and a second pixel opening, the first pixel opening exposes the third sub-electrode, the second pixel opening exposes the fourth sub-electrode, an orthographic projection of the first pixel opening on the base substrate is not overlapped with the orthographic projection of the first electrode plate via on the base substrate, and an orthographic projection of the second pixel opening on the base substrate is not overlapped with the orthographic projection of the first electrode plate via on the base substrate.

In an exemplary implementation mode, in the light transmitting region, a light transmitting opening is disposed on the pixel definition layer, and an orthographic projection of the light transmitting opening on the base substrate is not overlapped with an orthographic projection of the second electrode plate via on the base substrate.

In another aspect, an embodiment of the present disclosure also provides a display apparatus, including the aforementioned display substrate.

In yet another aspect, an embodiment of the present disclosure also provides a preparation method of a display substrate, wherein the display substrate includes multiple repetition units, at least one repetition unit includes a display region and a light transmitting region located on at least one side of the display region, the display region is configured to perform image display, and the light transmitting region is configured to transmit light, the display region includes multiple sub-pixels, at least one sub-pixel includes a pixel drive circuit and a light emitting device, the pixel drive circuit at least includes a storage capacitor, the storage capacitor at least includes a first electrode plate, the light emitting device at least includes a first electrode, the first electrode is connected with the first electrode plate through an electrode plate connection electrode; the preparation method includes: forming multiple conductive layers on a base substrate, wherein the first electrode plate, the electrode plate connection electrode, and the first electrode are disposed in different conductive layers, the first electrode plate is connected with the electrode plate connection electrode through a first electrode plate via, the first electrode is connected with the electrode plate connection electrode through a second electrode plate via, and in at least one sub-pixel, the second electrode plate via is disposed on a side of the first electrode plate via close to the light transmitting region.

Other aspects may be comprehended upon reading and understanding drawings and detailed description.

BRIEF DESCRIPTION OF DRAWINGS

Accompany drawings are used for providing further understanding of technical solutions of the present disclosure, and constitute a part of the specification. The accompany drawings, together with embodiments of the present disclosure, are used for explaining the technical solutions of the present disclosure, and do not constitute limitations on the technical solutions of the present disclosure.

Figure 1:
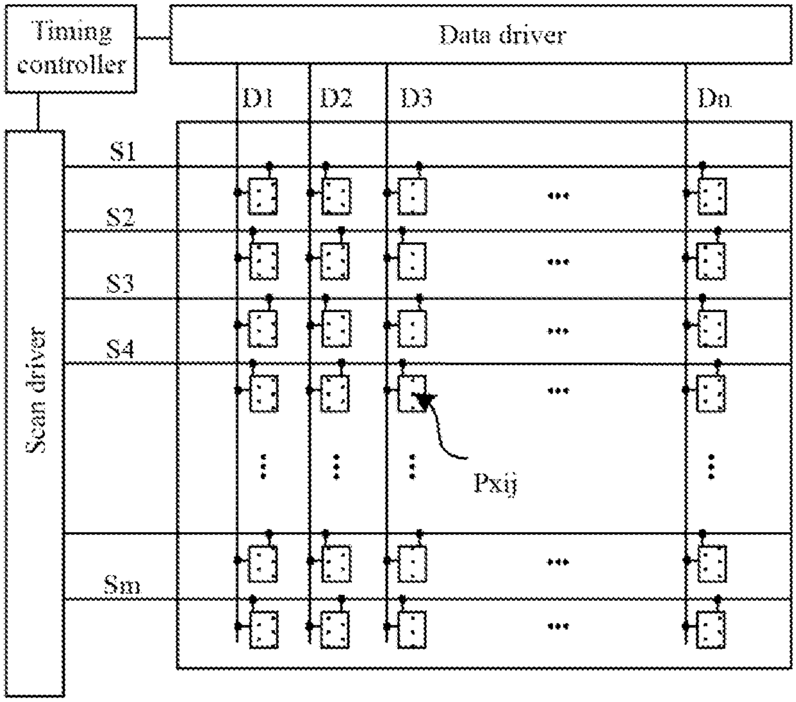
FIG. 1 is a schematic diagram of a structure of a display apparatus.

| Reference signs are described as follows. |
|---|
| 10-Base substrate; |
| 11-First electrode plate; |
| 12-Second electrode plate; |
| 13-Second gate electrode; |
| 21-First active layer; |
| 22-Second active layer; |
| 23-Third active layer; |
| 30-Scan signal line |
| 30-1-Double line segment; |
| 30-2-Single line segment; |
| 31-First power supply auxiliary line; |
| 32-Second power supply auxiliary line; |
| 33-First power supply connection line; |
| 34-Second power supply connection line; |

-continued

| Reference signs are described as follows. |
|---|
| 35-First auxiliary electrode; |
| 36-Second auxiliary electrode; |
| 37-Third auxiliary electrode; |
| 41-First connection electrode; |
| 42-Second connection electrode; |
| 43-Third connection electrode; |
| 44-Fourth connection electrode; |
| 45-Fifth connection electrode; |
| 46-Sixth connection electrode; |
| 50-Electrode plate connection electrode; |
| 50-1-First sub-connection electrode; |
| 50-2-Second sub-connection electrode; |
| 51-First power supply line; |
| 52-Second power supply line; |
| 53-Data signal line; |
| 54-Compensation signal line; |
| 61-First electrode; |
| 61-1-First sub-electrode; |
| 61-2-Second sub-electrode; |
| 61-3-Sub-connection electrode; |
| 62-Second electrode; |
| 62-1-Third sub-electrode; |
| 62-2-Fourth sub-electrode; |
| 71-First insulation layer; |
| 72-Second insulation layer; |
| 73-Third insulation layer; |
| 74-Planarization layer; |
| 75-Pixel definition layer; |
| 100-Repetition unit; |
| 110-Display region; |
| 120-Light transmitting region. |

DETAILED DESCRIPTION

To make objectives, technical solutions, and advantages of the present disclosure clearer, the embodiments of the present disclosure will be described in detail below in with reference to the accompany drawings. It is to be noted that the implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents recorded in following implementation modes only. The embodiments and features in the embodiments of the present disclosure may be randomly combined with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals “first”, “second”, “third”, etc., in the specification are set not to constitute limits in numbers but only to avoid confusion between constituent elements.

In the specification, for convenience, expressions “central”, “above”, “below”, “front”, “back”, “vertical”, “horizontal”, “top”, “bottom”, “inside”, “outside”, etc., indicating directional or positional relationships are used to illustrate positional relationships between the constituent elements with reference to the drawings, not to indicate or imply that a referred apparatus or element must have a specific orientation and be structured and operated with the specific orientation but only to easily and simply describe the present specification, and thus should not be understood as limitations on the present disclosure. The positional relationships between the constituent elements may be changed as appropriate according to a direction according to which each constituent element is described. Therefore, appropriate replacements based on situations are allowed, which is not limited to the expressions in the specification.

In the specification, unless otherwise specified and defined, terms "mounting", "mutual connection", and "connection" should be understood in a broad sense. For example, a connection may be a fixed connection, or a detachable connection, or an integral connection; it may be a mechanical connection or an electrical connection; it may be a direct connection, or an indirect connection through an intermediate, or internal communication inside two elements. Those of ordinary skills in the art may understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In a case that transistors with opposite polarities are used, or in a case that a direction of a current changes during operation of a circuit, or the like, functions of the "source electrode" and the "drain electrode" are sometimes interchangeable. Therefore, the "source electrode" and the "drain electrode", as well as a "source terminal" and a "drain terminal", are interchangeable in the specification.

In the specification, an "electrical connection" includes a case that constituent elements are connected together through an element with a certain electrical action. The "element with the certain electrical action" is not particularly limited as long as electrical signals between the connected constituent elements may be sent and received. Examples of the "element with the certain electrical action" not only include an electrode and a wiring, but also include a switching element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be a chamfer, an arc edge, deformation, etc.

In the present disclosure, "about" refers to that a boundary is not defined so strictly and numerical values within a range of process and measurement errors are allowed.

FIG. 1 is a schematic diagram of a structure of a display apparatus. As shown in FIG. 1, an OLED display apparatus may include a timing controller, a data driver, a scan driver, and a pixel array. The timing controller is connected with the data driver and the scan driver respectively, the data driver is connected with multiple data signal lines (D1 to Dn) respectively, and the scan driver is connected with multiple scan signal lines (S1 to Sm) respectively. The pixel array may include multiple sub-pixels PXij. Each sub-pixel PXij may be connected to a corresponding data signal line and a corresponding scan signal line, wherein i and j may be natural numbers. At least one sub-pixel PXij may at least include a circuit unit and a display unit. The circuit unit may at least include a pixel drive circuit, the pixel drive circuit is connected with a scan signal line and a data signal line, respectively, the display unit may at least include a light emitting device, and the light emitting device is connected with the pixel drive circuit of the circuit unit. The sub-pixel Pxij may refer to a sub-pixel whose pixel drive circuit is connected to an i-th scan signal line and a j-th data signal line. In an exemplary implementation mode, the timing controller may provide a control signal and a grayscale value suitable for a specification of the data driver to the data driver, and may provide a scan start signal, a clock signal, etc. suitable for a specification of the scan driver to the scan driver. The data driver may generate a data voltage to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a pixel row as a unit, wherein n may be a natural number. The scan driver may generate a scan signal to be provided to the scan signal lines S1, S2, S3, . . . , and Sm by receiving the clock signal and the scan start signal, etc. from the timing controller. For example, the scan driver may sequentially provide a scan signal with an on-level pulse to the scan signal lines S1 to Sm. For example, the scan driver may be constructed in a form of a shift register and generate a scan signal in a manner of sequentially transmitting a scan start signal provided in a form of an on-level pulse to a next-stage circuit under control of the clock signal, wherein m may be a natural number. In an exemplary implementation mode, the pixel array may be disposed on the display substrate.

With continuous development of display technologies, an OLED technology is increasingly applied in transparent display. Transparent display is an important personalized display field of the display technologies, which refers to implement image display in a transparent state, a viewer may see not only an image in a display apparatus, but also a scene behind the display apparatus, and Virtual Reality (VR), Augmented Reality (AR), and a 3D display function may be achieved. In a transparent display apparatus using the OLED technology, each sub-pixel is generally divided into a display region and a light transmitting region. The display region is provided with a pixel drive circuit and a light emitting device to achieve image display, and the light transmitting region is to achieve light transmission.

Figure 2:
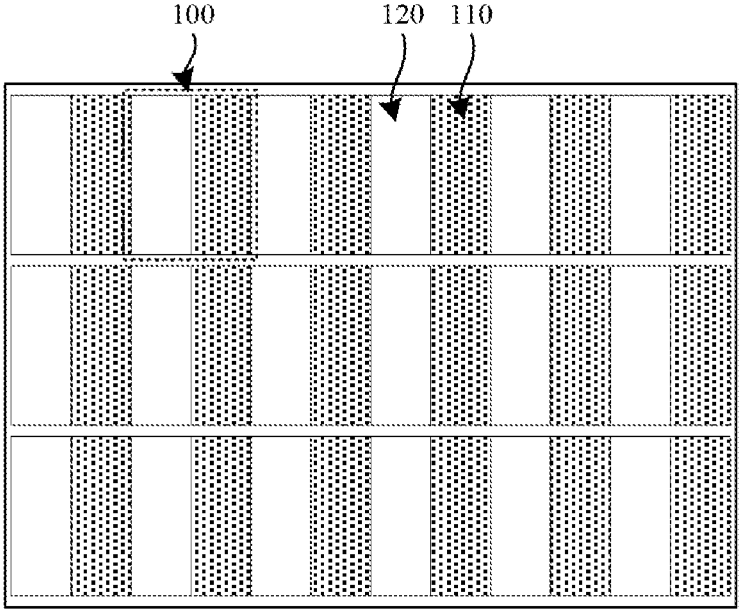
FIG. 2 is a schematic diagram of a planar structure of a display substrate.

FIG. 2 is a schematic diagram of a planar structure of a display substrate. As shown in FIG. 2, in an exemplary implementation mode, the display substrate may include multiple repetition units 100 arranged regularly, and at least one repetition unit 100 may include a display region 110 and a light transmitting region 120. The display region 110 may include multiple sub-pixels, and at least one sub-pixel may include a circuit unit and a light emitting unit. The circuit unit may at least include a pixel drive circuit, and the light emitting unit may at least include a light emitting device, the light emitting device of the light emitting unit is connected with a pixel drive circuit of a corresponding circuit unit. The display region 110 is configured to perform image display. The light transmitting region 120 may be located on at least one side of the display region 110 in the repetition unit 100, the light transmitting region 120 is configured to transmit light, so that the repetition unit 100 may achieve image display in a transparent state, i.e., transparent display. In an exemplary implementation mode, the repetition units are basic units constituting the display substrate, and the display substrate is constituted by repeating and continuously disposing the repetition units along at least one direction, i.e., the display substrate is formed by splicing multiple repetition units.

An embodiment of the present disclosure provides a display substrate, including multiple repetition units, wherein at least one repetition unit includes a display region and a light transmitting region located on at least one side of the display region, the display region is configured to perform image display, and the light transmitting region is configured to transmit light. The display region includes multiple sub-pixels, at least one sub-pixel includes a pixel drive circuit and a light emitting device, the pixel drive circuit at least includes a storage capacitor, the storage capacitor at least includes a first electrode plate, the light emitting device at least includes a first electrode, and the first electrode is connected with the first electrode plate through an electrode plate connection electrode. In a direction perpendicular to the display substrate, the display substrate at least includes multiple conductive layers disposed on a base substrate, the first electrode plate, the electrode plate connection electrode, and the first electrode are disposed in different conductive layers, the first electrode plate is connected with the electrode plate connection electrode through a first electrode plate via, the first electrode is connected with the electrode plate connection electrode through a second electrode plate via, and in at least one sub-pixel, the second electrode plate via is disposed on a side of the first electrode plate via close to the light transmitting region.

In an exemplary implementation mode, the display region further includes a first power supply line configured to supply a first power supply signal to the pixel drive circuit, and the first power supply line is disposed on a side of the display region close to the light transmitting region. The first electrode plate via is disposed on a side of the first power supply line away from the light transmitting region, the second electrode plate via is disposed on a side of the first power supply line close to the light transmitting region, and an orthographic projection of the electrode plate connection electrode on the base substrate is at least partially overlapped with an orthographic projection of the first power supply line on the base substrate.

In an exemplary implementation mode, the display region further includes a second power supply line configured to supply a second power supply signal to the light emitting device, and the second power supply line is disposed on a side of the display region close to the light transmitting region. The first electrode plate via is disposed on a side of the second power supply line away from the light transmitting region, the second electrode plate via is disposed on a side of the second power supply line close to the light transmitting region, and an orthographic projection of the electrode plate connection electrode on the base substrate is at least partially overlapped with an orthographic projection of the second power supply line on the base substrate.

In an exemplary implementation mode, the display substrate further includes at least one first auxiliary electrode and at least one second auxiliary electrode. The first auxiliary electrode and the second auxiliary electrode are disposed in the light transmitting region. The light emitting device further includes a third electrode connected with the second auxiliary electrode. The second auxiliary electrode is connected with the first auxiliary electrode through an auxiliary electrode via, and the first auxiliary electrode is connected with the second power supply line. There is a first distance between an edge of the second electrode plate via away from the second power supply line and an edge of the second power supply line close to the second electrode plate via, and there is a second distance between an edge of at least one auxiliary electrode via away from the second power supply line and an edge of the second power supply line close to the auxiliary electrode via, and the first distance is smaller than the second distance.

In an exemplary implementation mode, an area of an orthographic projection of the auxiliary electrode via on the base substrate is larger than an area of an orthographic projection of the second electrode plate via on the base substrate.

In an exemplary implementation mode, an area of an orthographic projection of the second electrode plate via on the base substrate is larger than an area of an orthographic projection of the first electrode plate via on the base substrate.

In an exemplary implementation mode, the multiple conductive layers at least include a first conductive layer disposed on the base substrate, a second conductive layer disposed on a side of the first conductive layer away from the base substrate, and a third conductive layer disposed on a side of the second conductive layer away from the base substrate. The first electrode plate is disposed in the first conductive layer, the electrode plate connection electrode is disposed in the second conductive layer, and the first electrode is disposed in the third conductive layer.

In an exemplary implementation mode, the display substrate further includes a first insulation layer, a second insulation layer, and a third insulation layer. The first insulation layer is disposed on a side of the first conductive layer away from the base substrate; the second insulation layer is disposed on a side of the first insulation layer away from the base substrate, and the second conductive layer is disposed on a side of the second insulation layer away from the base substrate; and the third insulation layer is disposed on a side of the second conductive layer away from the base substrate, and the third conductive layer is disposed on a side of the third insulation layer away from the base substrate. The first electrode plate via is disposed in the first insulation layer and the second insulation layer, and the second electrode plate via is disposed in the third insulation layer.

The display substrate of the present disclosure is illustrated with examples below through some exemplary embodiments.

In an exemplary implementation mode, in a direction parallel to the display substrate, the display substrate may include multiple repetition units arranged regularly, and at least one repetition unit may include a display region configured to perform image display and a light transmitting region configured to perform light transmission, thereby achieving transparent display. In a direction perpendicular to the display substrate, the display substrate may at least include a drive circuit layer disposed on the base substrate and a light emitting structure layer disposed on a side of the drive circuit layer away from the base substrate. In at least one repetition unit, the drive circuit layer of the display region may include multiple circuit units, the light emitting structure layer of the display region may include multiple light emitting units, a circuit unit may at least include a pixel drive circuit, and a light emitting unit may at least include a light emitting device connected with a pixel drive circuit of a corresponding circuit unit.

In an exemplary implementation mode, circuit units mentioned in the present disclosure refer to regions divided according to pixel drive circuits, and light emitting units mentioned in the present disclosure refer to regions divided according to light emitting devices. In an exemplary embodiment, a position of an orthographic projection of a light emitting unit on the base substrate may correspond to a position of an orthographic projection of a circuit unit on the base substrate, or the position of the orthographic projection of the light emitting unit on the base substrate may not correspond to the position of the orthographic projection of the circuit unit on the base substrate.

In an exemplary embodiment of the present disclosure, a position of an orthographic projection of a circuit unit on the base substrate is in one-to-one correspondence with a position of an orthographic projection of a light emitting unit on the base substrate, and the circuit unit and the light emitting unit constitute a sub-pixel. Therefore, sub-pixels are uniformly used to refer to circuit units and light emitting units in following contents.

Figure 3:
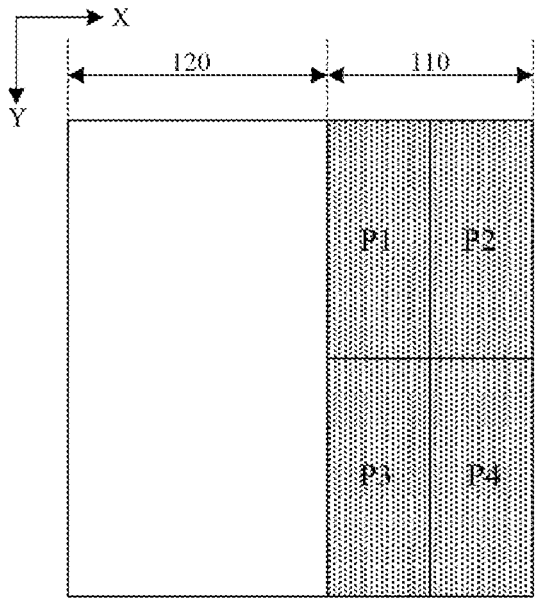
FIG. 3 is a schematic diagram of an arrangement of sub-pixels in a display substrate according to an exemplary embodiment of the present disclosure.

FIG. 3 is a schematic diagram of an arrangement of sub-pixels in a display substrate according to an exemplary embodiment of the present disclosure, illustrating a structure of a repetition unit. As shown in FIG. 3, the repetition unit may include a display region 110 and a light transmitting region 120, and the display region 110 may be located on a side of the light transmitting region 120 in a first direction X. In an exemplary implementation mode, the display region 110 may include four sub-pixels, i.e., a first sub-pixel P1, a second sub-pixel P2, a third sub-pixel P3, and a fourth sub-pixel P4, respectively, and the four sub-pixels may be arranged in a square manner to effectively increase an aperture ratio and an area of the light transmitting region.

In an exemplary implementation mode, the second sub-pixel P2 may be disposed on a side of the first sub-pixel P1 in the first direction X, the third sub-pixel P3 may be disposed on a side of the first sub-pixel P1 in a second direction Y, and the fourth sub-pixel P4 may be disposed on a side of the third sub-pixel P3 in the first direction X. Multiple sub-pixels sequentially disposed along the first direction X may be referred to as a pixel row, and multiple sub-pixels sequentially disposed along the second direction Y may be referred to as a pixel column, and the first direction X intersects with the second direction Y.

In an exemplary implementation mode, the first sub-pixel P1 may be a white sub-pixel (W) emitting white light, the second sub-pixel P2 may be a blue sub-pixel (B) emitting blue light, the third sub-pixel P3 may be a red sub-pixel (R) emitting red light, and the fourth sub-pixel P4 may be a green sub-pixel (G) emitting green light. In some possible implementation modes, an arrangement mode of WRBG may be adjusted according to actual needs, which is not specifically limited herein in the present disclosure.

In an exemplary implementation mode, each sub-pixel may at least include a pixel drive circuit and a light emitting device, and the light emitting device is connected with the pixel drive circuit.

Figure 4:
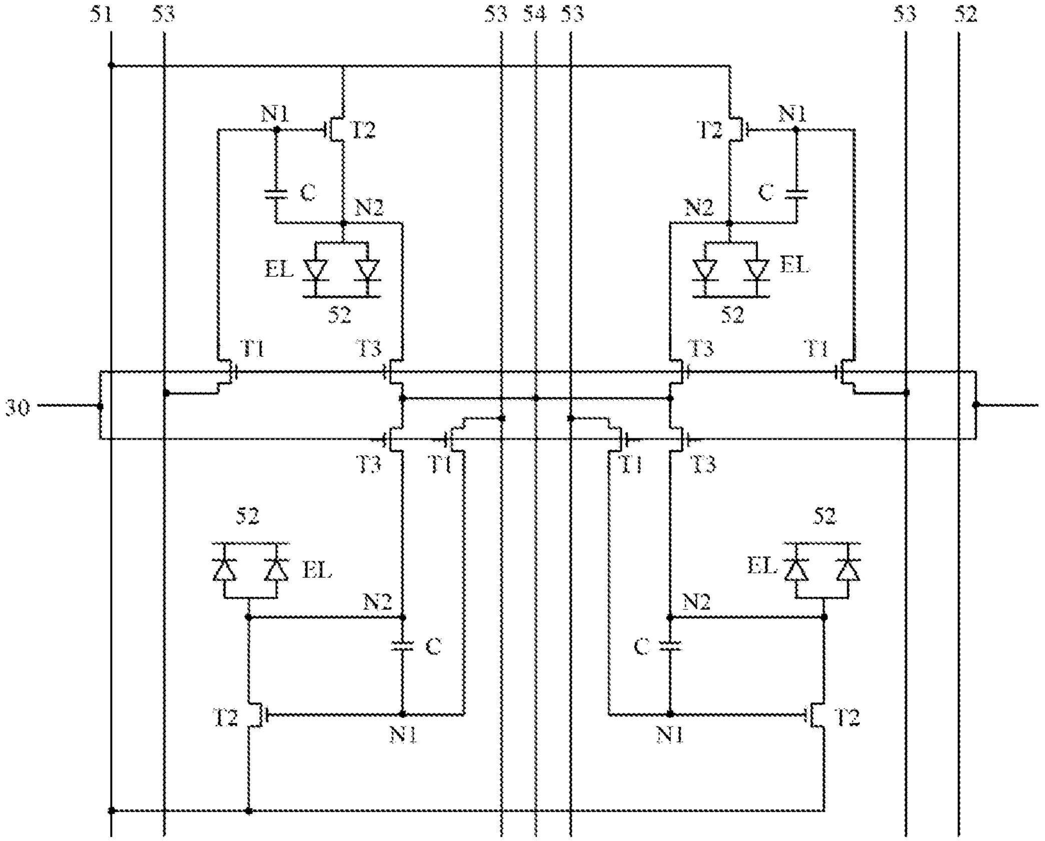
FIG. 4 is an equivalent circuit diagram of a pixel drive circuit in a display unit according to an exemplary embodiment of the present disclosure.

FIG. 4 is an equivalent circuit diagram of a pixel drive circuit in a display unit according to an exemplary embodiment of the present disclosure. As shown in FIG. 4, at least one display unit may include four pixel drive circuits, which may be arranged in a square manner, and the pixel drive circuits may be of a 3T1C structure.

In an exemplary implementation mode, at least one pixel drive circuit may include three transistors (a first transistor T1, a second transistor T2, and a third transistor T3) and one storage capacitor C, and the pixel drive circuit is connected with a scan signal line 30, a first power supply line 51, a data signal line 53, and a compensation signal line 54, respectively.

In an exemplary implementation mode, the pixel drive circuit may include a first node N1 and a second node N2. The first node N1 is connected with a second electrode of the first transistor T1, a gate electrode of the second transistor T2, and a first end of the storage capacitor C, respectively, and the second node N2 is connected with a second electrode of the second transistor T2, a second electrode of the third transistor T3, and a second end of the storage capacitor C, respectively.

In an exemplary implementation mode, the first end of the storage capacitor C is connected with the first node N1, the second end of the storage capacitor C is connected with the second node N2, and the storage capacitor C is used for storing a potential of the gate electrode of the second transistor T2.

In an exemplary implementation mode, the first transistor T1 may serve as a data writing transistor, the second transistor T2 may serve as a drive transistor, and the third transistor T3 may serve as a compensation transistor.

In an exemplary implementation mode, a gate electrode of the first transistor T1 is connected with the scan signal line 30, a first electrode of the first transistor T1 is connected with the data signal line 53, and the second electrode of the first transistor T1 is connected with the first node N1. When a turn-on signal is applied to the scan signal line 30, the first transistor T1 inputs a data signal of the data signal line 53 to the gate electrode of the second transistor T2.

In an exemplary implementation mode, the gate electrode of the second transistor T2 is connected with the first node N1, a first electrode of the second transistor T2 is connected with the first power supply line 51, and the second electrode of the second transistor T2 is connected with the second node N2. The second transistor T2 generates a corresponding current at the second electrode thereof under control of the data signal received by the gate electrode thereof.

In an exemplary implementation mode, a gate electrode of the third transistor T3 is connected with the scan signal line 30, a first electrode of the third transistor T3 is connected with the compensation signal line 54, and the second electrode of the third transistor is connected with the second node N2. When a turn-on signal is applied to the scan signal line 30, the third transistor T3 extracts a threshold voltage Vth and a mobility of the second transistor T2 in response to a compensation timing to compensate the threshold voltage Vth.

In an exemplary implementation mode, in a pixel drive circuit of at least one sub-pixel, the gate electrode of the first transistor T1 and the gate electrode of the third transistor T3 are connected with a same scan signal line 30.

In an exemplary implementation mode, in two pixel drive circuits of at least one pixel row, gate electrodes of two first transistors T1 and gate electrodes of two third transistors T3 are connected with a same scan signal line 30.

In an exemplary implementation mode, in four pixel drive circuits of at least one repetition unit, gate electrodes of four first transistors T1 and gate electrodes of four third transistors T3 are connected with a same scan signal line 30.

In an exemplary implementation mode, a light emitting device EL may be an OLED including a first electrode, an organic emitting layer, and a second electrode which are stacked, or may be a Quantum dot Light Emitting Diode (QLED) including a first electrode, a quantum dot emitting layer, and a second electrode which are stacked. The first electrode of the light emitting device EL is connected with the second node N2, the second electrode of the light emitting device EL is connected with the second power supply line 52, and the light emitting device EL emits light with corresponding brightness in response to a current of the second electrode of the second transistor T2. In an exemplary implementation mode, the first electrode may be an anode, and the second electrode may be a cathode; or, the first electrode may be a cathode and the second electrode may be an anode.

In an exemplary implementation mode, a signal of the first power supply line 51 is a continuously supplied high-level signal, and a signal of the second power supply line 52 is a continuously supplied low-level signal.

In an exemplary implementation mode, the first transistor T1 to the third transistor T3 may be P-type transistors, or may be N-type transistors. Use of a same type of transistors in a pixel drive circuit may simplify a process flow, reduce a process difficulty of a display panel, and improve a product yield. In some possible implementation modes, the first transistor T1 to the third transistor T3 may include a P-type transistor and an N-type transistor.

In an exemplary implementation mode, for the first transistor T1 to the third transistors T3, low temperature poly silicon thin film transistors may be used, or oxide thin film transistors may be used, or a low temperature poly silicon thin film transistor and an oxide thin film transistor may be used. An active layer of a low temperature poly silicon thin film transistor may be made of Low Temperature Poly Silicon (LTPS for short), and an active layer of an oxide thin film transistor may be made of an oxide semiconductor (Oxide). The low temperature poly silicon thin film transistor has advantages, such as a high mobility and fast charging, and the oxide thin film transistor has advantages, such a low drain current. The low temperature poly silicon thin film transistor and the oxide thin film transistor are integrated on one display substrate, i.e., an LTPS+Oxide (LTPO for short) display substrate, so that advantages of the low temperature poly silicon thin film transistor and the oxide thin film transistor may be utilized, low-frequency drive may be achieved, power consumption may be reduced, and display quality may be improved.

Figure 5:
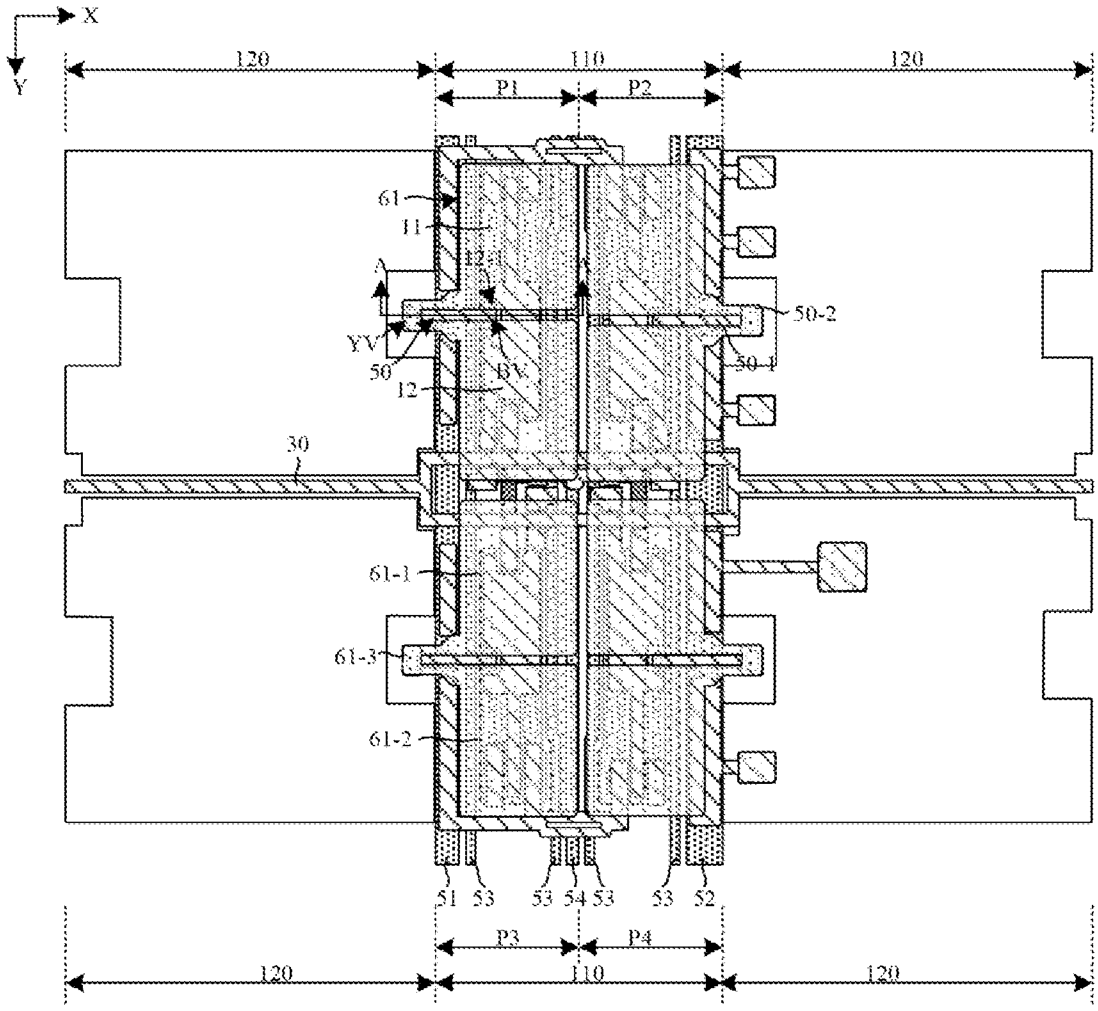
FIG. 5 is a schematic diagram of a structure of a display substrate according to an exemplary embodiment of the present disclosure.

FIG. 5 is a schematic diagram of a structure of a display substrate according to an exemplary embodiment of the present disclosure, illustrating a structure of a repetition unit. In an exemplary implementation mode, the display substrate may include multiple repetition units arranged regularly, and at least one repetition unit may include a display region 110 and a light transmitting region 120 located on at least one side of the display region 110. The display region 110 is configured to perform image display and the light transmitting region 120 is configured to transmit light. The display region 110 may include a first sub-pixel P1, a second sub-pixel P2, a third sub-pixel P3, and a fourth sub-pixel P4 arranged in a square manner, the second sub-pixel P2 may be disposed on a side of the first sub-pixel P1 in a first direction X, the third sub-pixel P3 may be disposed on a side of the first sub-pixel P1 in a second direction Y, the fourth sub-pixel P4 may be disposed on a side of the third sub-pixel P3 in the first direction X, and the first direction X intersects with the second direction Y. At least one sub-pixel may include a pixel drive circuit and a light emitting device connected with the pixel drive circuit.

As shown in FIG. 5, in an exemplary implementation mode, in at least one sub-pixel, the pixel drive circuit may at least include a storage capacitor, and the storage capacitor may at least include a first electrode plate 11 and a second electrode plate 12. An orthographic projection of the second electrode plate 12 on a plane of the display substrate is at least partially overlapped with an orthographic projection of the first electrode plate 11 on the plane of the display substrate. The light emitting device may at least include a first electrode 61 which may be connected with the first electrode plate 11 through an electrode plate connection electrode 50.

In an exemplary implementation mode, in a direction perpendicular to the display substrate, the display substrate may at least include multiple conductive layers disposed on a base substrate. The first electrode plate 11, the electrode plate connection electrode 50, and the first electrode 61 may be disposed in different conductive layers, the electrode plate connection electrode 50 may be connected with the first electrode plate 11 through a first electrode plate via BV, and the first electrode 61 may be connected with the electrode plate connection electrode 50 through a second electrode plate via YV. In at least one sub-pixel, the second electrode plate via YV may be disposed on a side of the first electrode plate via BV close to the light transmitting region 120, i.e., the second electrode plate via YV is disposed in a region closer to the light transmitting region 120 than the first electrode plate via BV.

In an exemplary implementation mode, an area of an orthographic projection of the second electrode plate via YV on the base substrate may be larger than an area of an orthographic projection of the first electrode plate via BV on the base substrate.

In an exemplary implementation mode, the multiple conductive layers of the display substrate may at least include a first conductive layer disposed on the base substrate, a second conductive layer disposed on a side of the first conductive layer away from the base substrate, and a third conductive layer disposed on a side of the second conductive layer away from the base substrate. The first electrode plate 11 may be disposed in the first conductive layer, the electrode plate connection electrode 50 may be disposed in the second conductive layer, and the first electrode 61 may be disposed in the third conductive layer.

In an exemplary implementation mode, the second electrode plate 12 and the electrode plate connection electrode 50 may be disposed in a same layer, and formed synchronously through a same patterning process.

In an exemplary implementation mode, a side of the second electrode plate 12 close to the light transmitting region 120 may be provided with an electrode plate groove 12-1 configured to accommodate the first electrode plate via BV, and an orthographic projection of the first electrode plate via BV on the base substrate may be within a range of an orthographic projection of the electrode plate groove 12-1 on the base substrate.

In an exemplary implementation mode, in at least one sub-pixel, the electrode plate connection electrode 50 may at least include a first sub-connection electrode 50-1 and a second sub-connection electrode 50-2. The first sub-connection electrode 50-1 may have a strip shape extending along the first direction X, and the second sub-connection electrode 50-2 may have a block shape. A first end of the first sub-connection electrode 50-1 is connected with the first electrode plate 11 through the first electrode plate via BV, a second end of the first sub-connection electrode 50-1 is connected with the second sub-connection electrode 50-2 after extending toward a direction close to the light transmitting region 120, and the second sub-connection electrode 50-2 is connected with the first electrode 61 through the second electrode plate via YV.

In an exemplary implementation mode, the first sub-connection electrode 50-1 and the second sub-connection electrode 50-2 may be disposed in a same layer, formed synchronously through a same patterning process, and of an interconnected integral structure.

In an exemplary implementation mode, in at least one sub-pixel, the first electrode 61 may at least include a first sub-electrode 61-1, a second sub-electrode 61-2, and a sub-connection electrode 61-3. The first sub-electrode 61-1 and the second sub-electrode 61-2 are disposed in isolation, the sub-connection electrode 61-3 may have a "C" shape, a first end of the sub-connection electrode 61-3 is connected with the first sub-electrode 61-1, a second end of the sub-connection electrode 61-3 is connected with the second sub-electrode 61-2, and a region between the first end of the sub-connection electrode 61-3 and the second end of the sub-connection electrode 61-3 is connected with the second sub-connection electrode 50-2 through the second electrode plate via YV after extending toward a direction close to the light transmitting region 120.

In an exemplary implementation mode, in at least one sub-pixel, the first sub-electrode 61-1, the second sub-electrode 61-2, and the sub-connection electrode 61-3 may be disposed in a same layer, formed synchronously through a same patterning process, and of an interconnected integral structure.

In an exemplary implementation mode, in at least one sub-pixel, an orthographic projection of the first sub-electrode 61-1 on the base substrate is not overlapped with an orthographic projection of the first electrode plate via BV on the base substrate, and an orthographic projection of the second sub-electrode 61-2 on the base substrate is not overlapped with the orthographic projection of the first electrode plate via BV on the base substrate.

Figure 6:
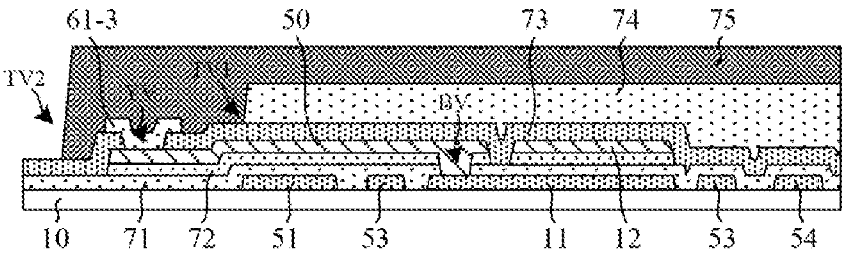
FIG. 6 is a sectional view taken along an A-A direction in FIG. 5.

FIG. 6 is a sectional view taken along an A-A direction in FIG. 5. As shown in FIG. 6, the display substrate may further include a first insulation layer 71, a second insulation layer 72, a third insulation layer 73, and a semiconductor layer. The first insulation layer 71 may be disposed on a side of the first electrode 11 away from the base substrate 10, the semiconductor layer may be disposed on a side of the first insulation layer 71 away from the base substrate 10, the second insulation layer 72 may be disposed on a side of the semiconductor layer away from the base substrate 10, the second electrode plate 12 and the electrode plate connection electrode 50 may be disposed on a side of the second insulation layer 72 away from the base substrate 10, the third insulation layer 73 may be disposed on a side of the second electrode plate 12 and the electrode plate connection electrode 50 away from the base substrate 10, and the sub-connection electrodes 61-3 in the first electrode 61 may be disposed on a side of the third insulation layer 73 away from the base substrate.

In an exemplary implementation mode, the first electrode plate via BV may be disposed in the first insulation layer 71 and the second insulation layer 72, and the first electrode plate via BV penetrates the first insulation layer 71 and the second insulation layer 72. The second electrode plate via YV may be disposed in the third insulation layer 73, and the second electrode plate via YV penetrates the third insulation layer 73.

In an exemplary implementation mode, the display substrate may further include a planarization layer 74 and a pixel definition layer 75.

In an exemplary implementation mode, the planarization layer 74 may be disposed on a side of the third insulation layer 73 away from the base substrate, the first sub-electrode 61-1 and the second sub-electrode 61-2 in the first electrode 61 may be disposed on a side of the planarization layer 74 away from the base substrate, the planarization layer 74 located in the light transmitting region is provided with a planarization opening TV1, the planarization layer within the planarization opening TV1 is removed, the second electrode plate via YV and the sub-connection electrode 61-3 are disposed within a region of the planarization opening TV1, and an orthographic projection of the second electrode plate via YV on the base substrate is within a range of an orthographic projection of the planarization opening TV1 on the base substrate.

In an exemplary implementation mode, the pixel definition layer 75 may be disposed on a side of the first electrode 61 away from the base substrate. The pixel definition layer 75 located in the display region is provided with a first pixel opening and a second pixel opening, and orthographic projections of the first pixel opening and the second pixel opening on the base substrate are not overlapped with an orthographic projection of the first electrode plate via BV on the base substrate. The pixel definition layer 75 located in the light transmitting region is provided with a light transmitting opening TV2, the pixel definition layer within the light transmitting opening TV2 is removed, the second electrode plate via YV and the sub-connection electrode 61-3 are disposed outside a region of the light transmitting opening TV2, and an orthographic projection of the second electrode plate via YV on the base substrate is not overlapped with an orthographic projection of the light transmitting opening TV2 on the base substrate.

As shown in FIGS. 5 and 6, at least one repetition unit may include one scan signal line 30, one first power supply line 51, one second power supply line 52, four data signal lines 53, and one compensation signal line 54. The scan signal line 30 may have a line shape in which a main body portion extends along the first direction X. The first power supply line 51, the second power supply line 52, the data signal lines 53, and the compensation signal line 54 may have line shapes in which main body portions extend along the second direction Y, and they may be disposed in the display region 110. In an exemplary implementation mode, a first power supply line 51, two data signal lines 53, a compensation signal line 54, other two data signal lines 53, and a second power supply line 52 may be disposed sequentially along the first direction X. In at least one repetition unit, the first power supply line 51 may be located on one side of the display region 110 in the first direction X, the second power supply line 52 may be located on the other side of the display region 110 in the first direction X, the compensation signal line 54 may be located between the first power supply line 51 and the second power supply line 52, two of the four data signal lines 53 may be located between the first power supply line 51 and the compensation signal line 54, and the other two of the four data signal lines 53 may be located between the second power supply line 52 and the compensation signal line 54.

In an exemplary implementation mode, positions of the first power supply line 51 and the second power supply line 52 may be substantially mirror-symmetrical with respect to the compensation signal line 54, and two data signal lines 53 located on a side of the compensation signal line 54 in an opposite direction of the first direction X and two data signal lines 53 located on a side of the compensation signal line 54 in the first direction X may be substantially mirror-symmetrical with respect to the compensation signal line 54.

In an exemplary implementation mode, one scan signal line 30 may define two adjacent pixel rows, one compensation signal line 54 may define two adjacent pixel columns, and the scan signal line 30 and the compensation signal line 54 define four sub-pixels.

In an exemplary implementation mode, in at least one sub-pixel, a pixel drive circuit may be connected with a scan signal line 30, a first power supply line 51, a data signal line 53, and a compensation signal line 54, respectively. A light emitting device is connected with a second power supply line 52. The scan signal line 30 is configured to supply a scan signal to the pixel drive circuit, the first power supply line 51 is configured to supply a first power supply signal to the pixel drive circuit, the data signal line 53 is configured to supply a data signal to the pixel drive circuit, the compensation signal line 54 is configured to supply a compensation signal to the pixel drive circuit, and the second power supply line 52 is configured to supply a second power supply signal to a third electrode of the light emitting device.

In an exemplary implementation mode, the first power supply line 51, the second power supply line 52, the data signal line 53, and the compensation signal line 54 may be disposed in a same layer as the first electrode plate 11, and formed synchronously through a same patterning process.

In an exemplary implementation mode, the scan signal lines 30 and the electrode plate connection electrode 50 may be disposed in a same layer, and formed synchronously through a same patterning process.

In an exemplary implementation mode, the pixel drive circuit may further include a first transistor as a data writing transistor, a second transistor as a drive transistor, and a third transistor as a compensation transistor. In at least one repetition unit, gate electrodes of four first transistors and gate electrodes of four third transistors are connected with a same scan signal line 30.

In an exemplary implementation mode, the first light transmitting region 120-1 may be disposed on a side of the display region 110 in an opposite direction of the first direction X, the first power supply line 51 may be disposed on a side of the display region 110 close to the first light transmitting region 120-1, and the electrode plate connection electrode 50 may be connected with the first electrode plate 11 and the first electrode 61, respectively, across the first power supply line 51.

In an exemplary implementation mode, the first electrode plate via BV may be disposed on a side of the first power supply line 51 away from the first light transmitting region 120-1, the second electrode plate via YV may be disposed on a side of the first power supply line 51 close to the first light transmitting region 120-1, and an orthographic projection of the electrode plate connection electrode 50 on the base substrate is at least partially overlapped with an orthographic projection of the first power supply line 51 on the base substrate.

In an exemplary implementation mode, the second light transmitting region 120-2 may be disposed on a side of the display region 110 in the first direction X, the second power supply line 52 may be disposed on a side of the display region 110 close to the second light transmitting region 120-2, and the electrode plate connection electrode 50 may be connected with the first electrode plate 11 and the first electrode 61, respectively, across the second power supply line 52.

In an exemplary implementation mode, the first electrode plate via BV may be disposed on a side of the second power supply line 52 away from the second light transmitting region 120-2, the second electrode plate via YV may be disposed on a side of the second power supply line 52 close to the second light transmitting region 120-2, and an orthographic projection of the electrode plate connection electrode 50 on the base substrate is at least partially overlapped with an orthographic projection of the first power supply line 51 on the base substrate.

Exemplary description is made below through a preparation process of a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or another process. If the "thin film" does not need to be processed through a patterning process in an entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are disposed in a same layer" in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B being within a range of an orthographic projection of A" or "an orthographic projection of A containing an orthographic projection of B" means that a boundary of the orthographic projection of B falls within a range of a boundary of the orthographic projection of A, or the boundary of the orthographic projection of A is overlapped with the boundary of the orthographic projection of B.

In an exemplary implementation mode, taking four sub-pixels (a first sub-pixel P1, a second sub-pixel P2, a third sub-pixel P3, and a fourth sub-pixel P4) of a repetition unit as an example, a preparation process of a display substrate of an exemplary embodiment of the present disclosure may include following operations.

Figure 7:
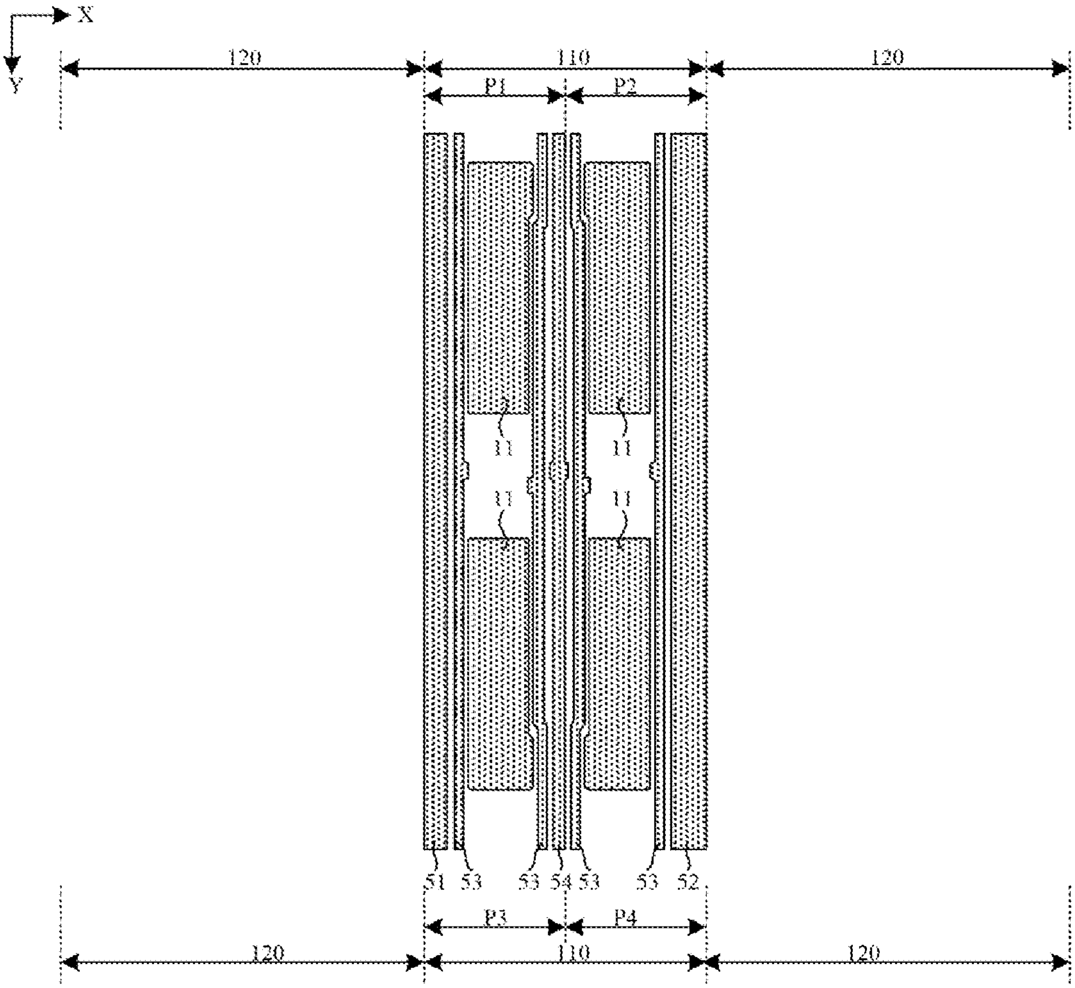
FIG. 7 is a schematic diagram after forming a pattern of a first conductive layer according to an embodiment of the present disclosure.

(1) Forming a pattern of a first conductive layer. In an exemplary implementation mode, forming the pattern of the first conductive layer includes: depositing a first conductive thin film on a base substrate, patterning the first conductive thin film through a patterning process, to form a pattern of a first conductive layer on the base substrate, as shown in FIG. 7. In an exemplary implementation mode, the first conductive layer may be referred to as a light Shielding Layer (SHL).

In an exemplary implementation mode, the first conductive layer of each sub-pixel in the display substrate may at least include a first electrode plate 11.

In an exemplary implementation mode, the first electrode plate 11 may have a rectangular shape, and corners of the rectangular shape may be provided with chamfers. The first electrode plate 11 may serve as a lower electrode plate of a storage capacitor (a second end of the storage capacitor), and the first electrode plate 11 is configured to form the storage capacitor with a subsequently formed second electrode plate.

In an exemplary implementation mode, the first electrode plate 11 is further configured to shield light for a second transistor, reduce an intensity of light irradiated on the second transistor, and reduce a leakage current of the second transistor, thereby reducing an influence of illumination on characteristics of the second transistor.

In an exemplary implementation mode, a position and a shape of a first electrode plate 11 in the first sub-pixel P1 and a position and a shape of a first electrode plate 11 in the third sub-pixel P3 may be substantially mirror-symmetrical with respect to a horizontal reference line, and a position and a shape of a first electrode plate 11 in the second sub-pixel P2 and a position and a shape of a first electrode plate 11 in the fourth sub-pixel P4 may be substantially mirror-symmetrical with respect to the horizontal reference line. The position and the shape of the first electrode plate 11 in the first sub-pixel P1 and the position and the shape of the first electrode plate 11 in the second sub-pixel P2 may be substantially mirror-symmetrical with respect to a vertical reference line, and the position and the shape of the first electrode plate 11 in the third sub-pixel P3 and the position and the shape of the first electrode plate 11 in the fourth sub-pixel P4 may be substantially mirror-symmetrical with respect to the vertical reference line. The horizontal reference line may be a straight line extending along a first direction X and bisecting a display region in a second direction Y, and the vertical reference line may be a straight line extending along the second direction Y and bisecting the display region in the first direction X.

In an exemplary implementation mode, the first conductive layer of each repetition unit in the display substrate may further at least include one first power supply line 51, one second power supply line 52, four data signal lines 53, and one compensation signal line 54.

In an exemplary implementation mode, the first power supply line 51, the second power supply line 52, the data signal lines 53, and the compensation signal line 54 each may have a straight line shape or a polyline shape in which a main body portion extends along the second direction Y. The first power supply line 51 may be located on a side of the repetition unit in an opposite direction of the first direction X, the second power supply line 52 may be located on a side of the repetition unit in the first direction X, the compensation signal line 54 may be located between two first power supply lines 51, a first data signal line 53 of the four data signal lines 53 may be located on a side of the first power supply line 51 close to the compensation signal line 54, a second data signal line 53 of the four data signal lines 53 may be located on a side of the compensation signal line 54 close to the first power supply line 51, a third data signal line 53 of the four data signals lines 54 may be located on a side of the compensation signal line 54 close to the second power supply line 52, and a fourth data signal line 53 of the four data signal lines 53 may be located on a side of the second power supply line 52 close to the compensation signal line 54.

In an exemplary implementation mode, the first power supply line 51 and the compensation signal line 54 may define a first pixel column, and the first data signal line 53 and the second data signal line 53 may be disposed in the first pixel column and located on two sides of the first electrode plate 11 in the first direction X. The second power supply line 52 and the compensation signal line 54 may define a second pixel column, and the third data signal line 53 and the fourth data signal line 53 may be disposed in the second pixel column and located on two sides of the first electrode plate 11 in the first direction X.

In an exemplary implementation mode, positions of the first power supply line 51 and the second power supply line 52 may be substantially mirror-symmetrical with respect to a vertical reference line, and positions of two data signal lines 53 located on a side of the compensation signal line 54 in an opposite direction of the first direction X and positions of two data signal lines 53 located on a side of the compensation signal line 54 in the first direction X may be substantially mirror-symmetrical with respect to the vertical reference line.

In an exemplary implementation mode, the first power supply line 51, the second power supply line 52, the data signal lines 53, and the compensation signal line 54 may be straight lines or polylines with equal width, or straight lines or polylines of unequal width. Using straight lines or polylines with variable widths may not only facilitate a layout of a pixel structure, but also reduce parasitic capacitance.

After this patterning process, the first electrode plate 11, the first power supply line 51, the second power supply line 52, the data signal lines 53, and the compensation signal line 54 are formed in a display region 110, and a light transmitting region 120 does not have a corresponding film layer.

Figure 8A:
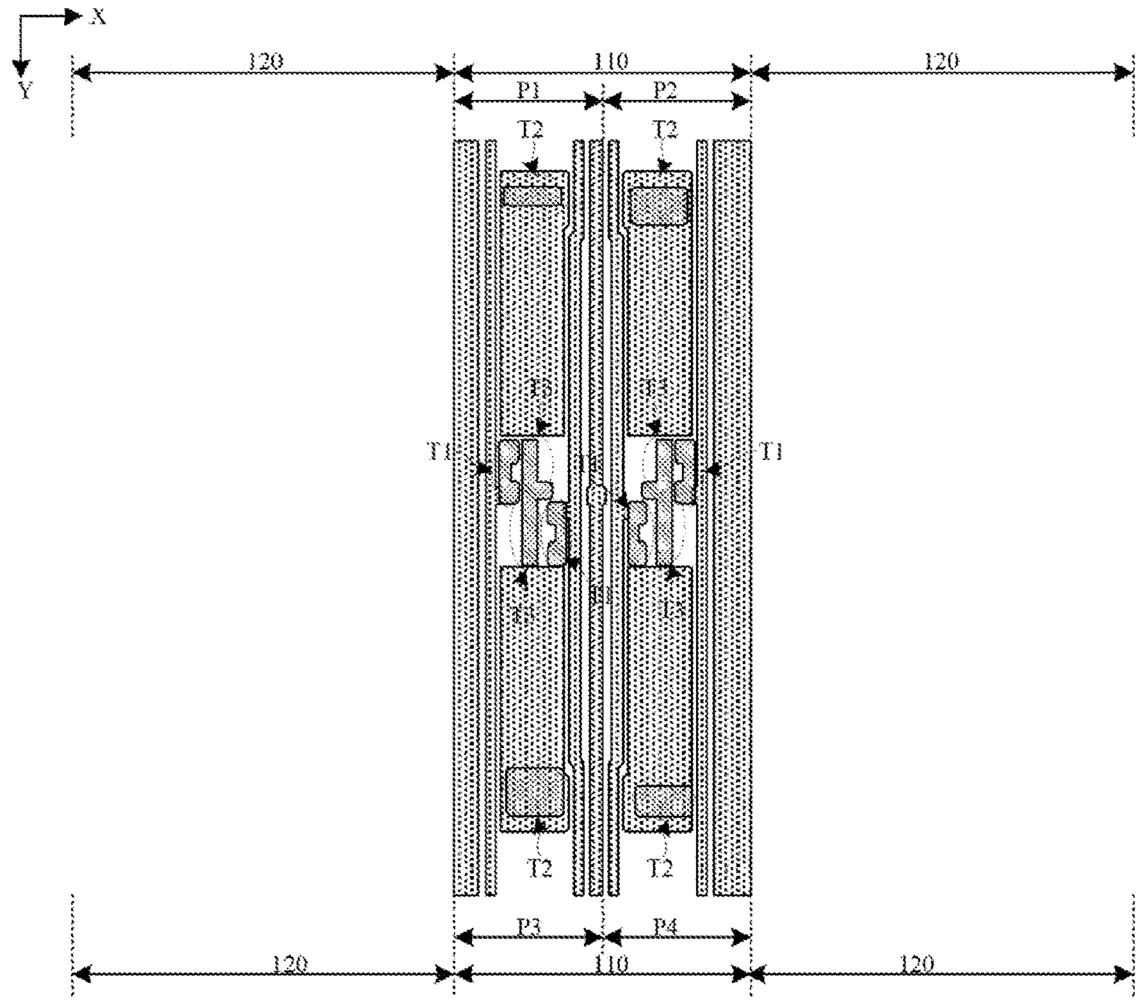
FIGS. 8A and 8B are schematic diagrams after forming a pattern of a semiconductor layer according to an embodiment of the present disclosure.
Figure 8B:
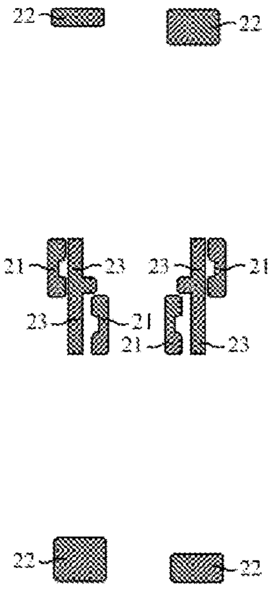

(2) Forming a pattern of a semiconductor layer. In an exemplary implementation mode, forming the pattern of the semiconductor layer may include: sequentially depositing a first insulation thin film and a semiconductor thin film on the base substrate on which the aforementioned pattern is formed, and patterning the semiconductor thin film through a patterning process, to form a first insulation layer covering the first conductive layer and a semiconductor layer disposed on the first insulation layer, as shown in FIGS. 8A and 8B, wherein FIG. 8B is a schematic diagram of the semiconductor layer in FIG. 8A.

In an exemplary implementation mode, the semiconductor layer of each sub-pixel in the display substrate may at least include a first active layer 21 as an active layer of a first transistor T1, a second active layer 22 as an active layer of a second transistor T2, and a third active layer 23 as an active layer of a third transistor T3.

In an exemplary implementation mode, for the first sub-pixel P1 and the second sub-pixel P2, a first active layer 21 and a third active layer 23 may be disposed on a side of a first electrode plate 11 of a present sub-pixel in the second direction Y, and a second active layer 22 may be disposed in an end region of the first electrode plate 11 of the present sub-pixel away from the first active layer 21 and the third active layer 23. An orthographic projection of the second active layer 22 on the base substrate is within a range of an orthographic projection of the first electrode plate 11 of the present sub-pixel on the base substrate, so that the first electrode plate 11 as a shielding layer may shield a channel region of the second transistor T2, thereby avoiding an influence of light on a channel, and ensuring electrical performance of the second transistor T2. A third active layer 23 of the first sub-pixel P1 may be disposed on a side of a first active layer 21 of a present sub-pixel in the first direction X, and a third active layer 23 of the second sub-pixel P2 may be disposed on a side of a first active layer 21 of a present sub-pixel in an opposite direction of the first direction X.

In an exemplary implementation mode, for the third sub-pixel P3 and the fourth sub-pixel P4, a first active layer 21 and a third active layer 23 may be disposed on a side of a first electrode plate 11 of a present sub-pixel in an opposite direction of the second direction Y, and a second active layer 22 may be disposed in an end region of the first electrode plate 11 of the present sub-pixel away from the first active layer 21 and the third active layer 23. An orthographic projection of the second active layer 22 on the base substrate is within a range of an orthographic projection of the first electrode plate 11 of the present sub-pixel on the base substrate, so that the first electrode plate 11 as a shielding layer may shield a channel region of the second transistor T2, thereby avoiding an influence of light on a channel, and ensuring electrical performance of the second transistor T2. A third active layer 23 of the third sub-pixel P3 may be disposed on a side of a first active layer 21 of a present sub-pixel in an opposite direction of the first direction X, and a third active layer 23 of the fourth sub-pixel P4 may be disposed on a side of a first active layer 21 of a present sub-pixel in the first direction X.

In an exemplary implementation mode, a third active layer 23 of the first sub-pixel P1 and a third active layer 23 of the third sub-pixel P3 may be of an interconnected integral structure, and a third active layer 23 of the second sub-pixel P2 and a third active layer 23 of the fourth sub-pixel P4 may be of an interconnected integral structure, that is, third active layers 23 of two sub-pixels in adjacent pixel rows may be of an interconnected integral structure. By setting that second transistors of two adjacent sub-pixels in a pixel column share a source in the present disclosure, not only space is saved, but also a via connection structure is reduced and the preparation process is simplified.

In an exemplary implementation mode, the first active layer 21 and the third active layer 23 may each have an "I" shape, the second active layer 22 may have a block (such as a rectangle) shape, and corners of the block shape may be provided with chamfers.

In an exemplary implementation mode, an orthographic projection of the first active layer 21 on the base substrate is not overlapped with an orthographic projection of the first electrode plate 11 on the base substrate, and an orthographic projection of the third active layer 23 on the base substrate is not overlapped with the orthographic projection of the first electrode plate 11 on the base substrate. In the present disclosure, by setting that there is no overlapping region between the first active layer 21 and the first electrode plate 11, and between the third active layer 23 and the first electrode plate 11, it is beneficial to design a channel width-to-length ratio of the first transistor and the third transistor according to relevant requirements.

In an exemplary implementation mode, positions and shapes of a first active layer 21 and a third active layer 23 in the first sub-pixel P1 and positions and shapes of a first active layer 21 and a third active layer 23 in the second sub-pixel P2 may be substantially mirror-symmetrical with respect to a vertical reference line, positions and shapes of a first active layer 21 and a third active layer 23 in the third sub-pixel P3 and positions and shapes of a first active layer 21 and a third active layer 23 in the fourth sub-pixel P4 may be substantially mirror-symmetrical with respect to the vertical reference line, a position of a second active layer 22 in the first sub-pixel P1 and a position of a second active layer 22 in the second sub-pixel P2 may be substantially mirror-symmetrical with respect to the vertical reference line, a position of a second active layer 22 in the third sub-pixel P3 and a position of a second active layer 22 in the fourth sub-pixel P4 may be substantially mirror-symmetrical with respect to the vertical reference line, a position of a second active layer 22 in the first sub-pixel P1 and a position of a second active layer 22 in the third sub-pixel P3 may be substantially mirror-symmetrical with respect to a horizontal reference line, and a position of a second active layer 22 in the second sub-pixel P2 and a position of a second active layer 22 in the fourth sub-pixel P4 may be substantially mirror-symmetrical with respect to the horizontal reference line.

In an exemplary implementation mode, an active layer of each transistor may include a first region, a second region, and a channel region located between the first region and the second region.

In an exemplary implementation mode, the semiconductor layer may be made of a metal oxide, such as an oxide containing indium and tin, an oxide containing tungsten and indium, an oxide containing tungsten, indium, and zinc, an oxide containing titanium and indium, an oxide containing titanium, indium, and tin, an oxide containing indium and zinc, an oxide containing silicon, indium, and tin, and an oxide containing indium, gallium, and zinc. The semiconductor layer may be a single layer, a double-layer, or a multi-layer.

In an exemplary implementation mode, after this patterning process, the pattern of the semiconductor layer is formed in the display region 110, and a film layer of the light transmitting region 120 includes the first insulation layer.

Figure 9:
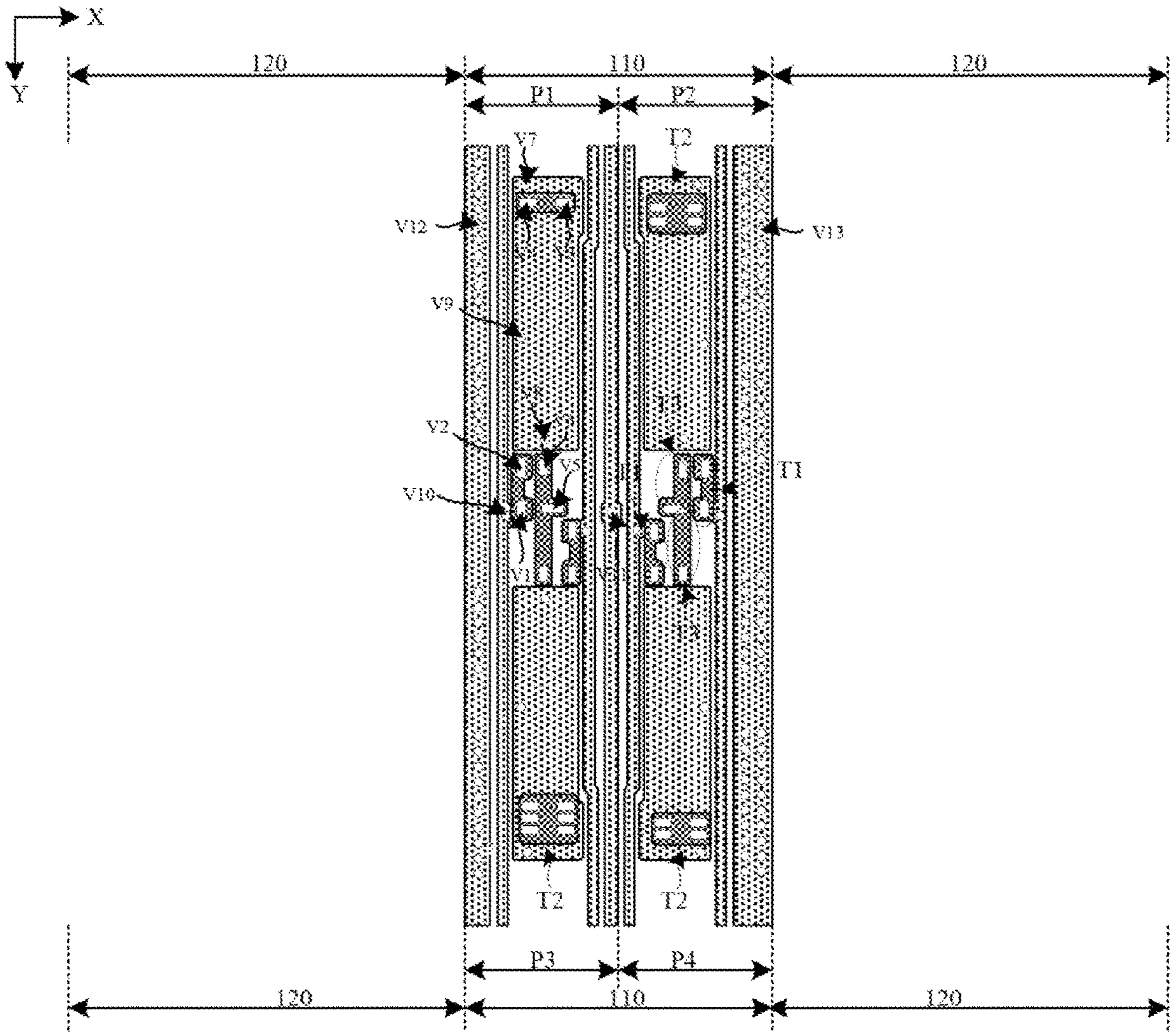
FIG. 9 is a schematic diagram after forming a pattern of a second insulation layer according to an embodiment of the present disclosure.

(3) Forming a pattern of a second insulation layer. In an exemplary implementation mode, forming the pattern of the second insulation layer may include: depositing a second insulation thin film on the base substrate on which the aforementioned patterns are formed, and patterning the second insulation thin film through a patterning process, to form a pattern of a second insulation layer covering the semiconductor layer, wherein multiple vias are disposed on the second insulation layer, as shown in FIG. 9.

In an exemplary implementation mode, multiple vias of each sub-pixel in the display substrate may at least include a first via V1, a second via V2, a third via V3, a fourth via V4, a fifth via V5, a sixth via V6, a seventh via V7, an eighth via V8, a ninth via V9, and a tenth via V10.

In an exemplary implementation mode, an orthographic projection of the first via V1 on the base substrate is within a range of an orthographic projection of a first region of a first active layer on the base substrate, the second insulation layer within the first via V1 is etched away to expose a surface of the first region of the first active layer, and the first via V1 is configured to enable a subsequently formed first connection electrode to be connected with the first region of the first active layer through the via.

In an exemplary implementation mode, an orthographic projection of the second via V2 on the base substrate is within a range of an orthographic projection of a second region of the first active layer on the base substrate, the second insulation layer within the second via V2 is etched away to expose a surface of the second region of the first active layer, and the second via V2 is configured to enable a subsequently formed second connection electrode to be connected with the second region of the first active layer through the via.

In an exemplary implementation mode, an orthographic projection of the third via V3 on the base substrate is within a range of an orthographic projection of a first region of a second active layer on the base substrate, the second insulation layer within the third via V3 is etched away to expose a surface of the first region of the second active layer, and the third via V3 is configured to enable a subsequently formed third connection electrode to be connected with the first region of the second active layer through the via. In an exemplary implementation mode, there may be multiple third vias V3 in some sub-pixels to increase connection reliability.

In an exemplary implementation mode, an orthographic projection of the fourth via V4 on the base substrate is within a range of an orthographic projection of a second region of the second active layer on the base substrate, the second insulation layer within the fourth via V4 is etched away to expose a surface of the second region of the second active layer, and the fourth via V4 is configured to enable a subsequently formed fourth connection electrode to be connected with the second region of the second active layer through the via. In an exemplary implementation mode, there may be multiple fourth vias V4 in some sub-pixels to increase connection reliability.

In an exemplary implementation mode, an orthographic projection of the fifth via V5 on the base substrate is within a range of an orthographic projection of a first region of a third active layer on the base substrate, the second insulation layer within the fifth via V5 is etched away to expose a surface of the first region of the third active layer, and the fifth via V5 is configured to enable a subsequently formed fifth connection electrode to be connected with the first region of the third active layer through the via. In an exemplary implementation mode, since third active layers 23 of two adjacent sub-pixels in one pixel column in the second direction Y is of an interconnected integral structure and the two sub-pixels share the first region of the third active layer, the two sub-pixels share one fifth via V5.

In an exemplary implementation mode, an orthographic projection of the sixth via V6 on the base substrate is within a range of an orthographic projection of a second region of the third active layer on the base substrate, the second insulation layer within the sixth via V6 is etched away to expose a surface of the second region of the third active layer, and the sixth via V6 is configured to enable a subsequently formed sixth connection electrode to be connected with the second region of the third active layer through the via.

In an exemplary implementation mode, an orthographic projection of the seventh via V7 on the base substrate is within a range of an orthographic projection of the first electrode plate 11 on the base substrate and is disposed in an end region of a first electrode plate 11 of each sub-pixel away from the second active layer 22, the second insulation layer and the first insulation layer within the seventh via V7 are etched away to expose a surface of the first electrode plate 11, and the seventh via V7 is configured to enable a subsequently formed fourth connection electrode to be connected with the first electrode plate 11 through the via.

In an exemplary implementation mode, an orthographic projection of the eighth via V8 on the base substrate is within a range of an orthographic projection of the first electrode plate 11 on the base substrate and is disposed in an end region of the first electrode plate 11 of each sub-pixel close to the third active layer 23, the second insulation layer and the first insulation layer within the eighth via V8 are etched away to expose a surface of the first electrode plate 11, and the eighth via V8 is configured to enable a subsequently formed sixth connection electrode to be connected with the first electrode plate 11 through the via.

In an exemplary implementation mode, an orthographic projection of the ninth via V9 on the base substrate is within a range of an orthographic projection of the first electrode plate 11 on the base substrate and is disposed in an end region of the first electrode plate 11 of each sub-pixel away from the compensation signal line 54, the second insulation layer and the first insulation layer within the ninth via V9 are etched away to expose a surface of the first electrode plate 11, and the ninth via V9 is configured to enable a subsequently formed electrode plate connection electrode to be connected with the first electrode plate 11 through the via.

In an exemplary implementation mode, the ninth via V9 serves as a first electrode plate via of the present disclosure. For the light transmitting region 120 located on a side of the first power supply line 51 in an opposite direction of the first direction X, the ninth via V9 is disposed on a side of the first power supply line 51 away from the light transmitting region 120. For the light transmitting region 120 located on a side of the second power supply line 52 in the first direction X, the ninth via V9 is disposed on a side of the second power supply line 52 away from the light transmitting region 120.

In an exemplary implementation mode, an orthographic projection of the tenth via V10 on the base substrate is within a range of an orthographic projection of a data signal line 53 on the base substrate, the second insulation layer and the first insulation layer within the tenth Via V10 are etched away to expose a surface of the data signal line 53, and the tenth via V10 is configured to enable a subsequently formed first connection electrode to be connected with the data signal line 53 through the via.

In an exemplary implementation mode, the at least one repetition unit may further include an eleventh via V11, a twelfth via V12, and a thirteenth via V13.

In an exemplary implementation mode, an orthographic projection of the eleventh via V11 on the base substrate is within a range of an orthographic projection of the compensation signal line 54 on the base substrate, the second insulation layer and the first insulation layer within the eleventh via V11 are etched away to expose a surface of the compensation signal line 54, and the eleventh via V11 is configured to enable a subsequently formed fifth connection electrode to be connected with the compensation signal line 54 through the via.

In an exemplary implementation mode, the twelfth via V12 may be disposed in the first sub-pixel P1 and the third sub-pixel P3, an orthographic projection of the twelfth via V12 on the base substrate is within a range of an orthographic projection of the first power supply line 51 on the base substrate, the second insulation layer and the first insulation layer within the twelfth via V12 are etched away to expose a surface of the first power supply line 51, and the twelfth via V12 is configured to enable a subsequently formed first power supply auxiliary line to be connected with the first power supply line 51 through the via. In an exemplary implementation mode, there may be multiple twelfth vias V12 which may be disposed sequentially along the second direction Y to improve connection reliability.

In an exemplary implementation mode, the thirteenth via V13 may be disposed in the second sub-pixel P2 and the fourth sub-pixel P4, an orthographic projection of the thirteenth via V13 on the base substrate is within a range of an orthographic projection of the second power supply line 52 on the base substrate, the second insulation layer and the first insulation layer within the thirteenth via V13 are etched away to expose a surface of the second power supply line 52, and the thirteenth via V13 is configured to enable a subsequently formed second power supply auxiliary line to be connected with the second power supply line 52 through the via. In an exemplary implementation mode, there may be multiple thirteenth vias V13 which may be disposed sequentially along the first direction X and the second direction Y to increase connection reliability.

In an exemplary implementation mode, a Half Tone Mask process may be adopted for this patterning process.

In an exemplary implementation mode, in a process of forming the pattern of the second insulation layer, multiple vias may be formed using a dry etching process, and at the same time, the semiconductor layer exposed within the vias is subjected to a conductorization treatment for a first time. In the conductorization treatment for the first time, an edge portion of the semiconductor layer covered by the second insulation layer close to the vias will also be conductorized, that is, the semiconductor layer which is conductorized for the first time will extend toward a direction away from the vias.

After this patterning process, the film layer of the light transmitting region 120 includes the first insulation layer and the second insulation layer.

Figure 10A:
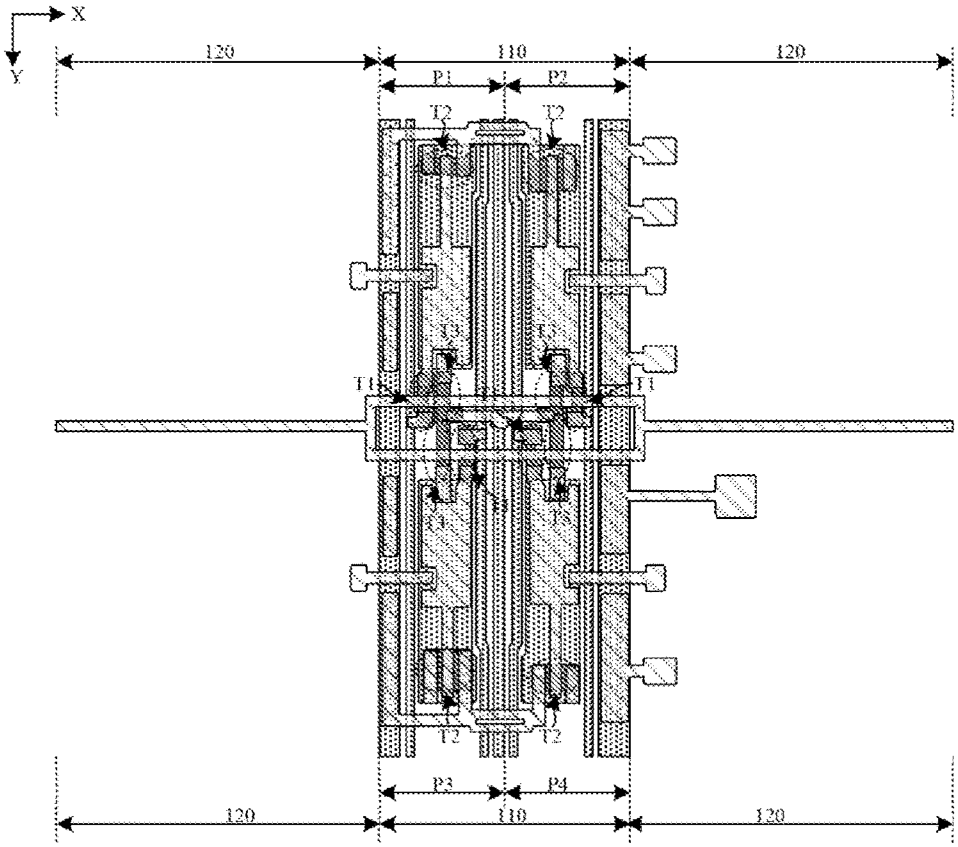
FIGS. 10A and 10B are schematic diagrams after forming a pattern of a second conductive layer according to an embodiment of the present disclosure.
Figure 10B:
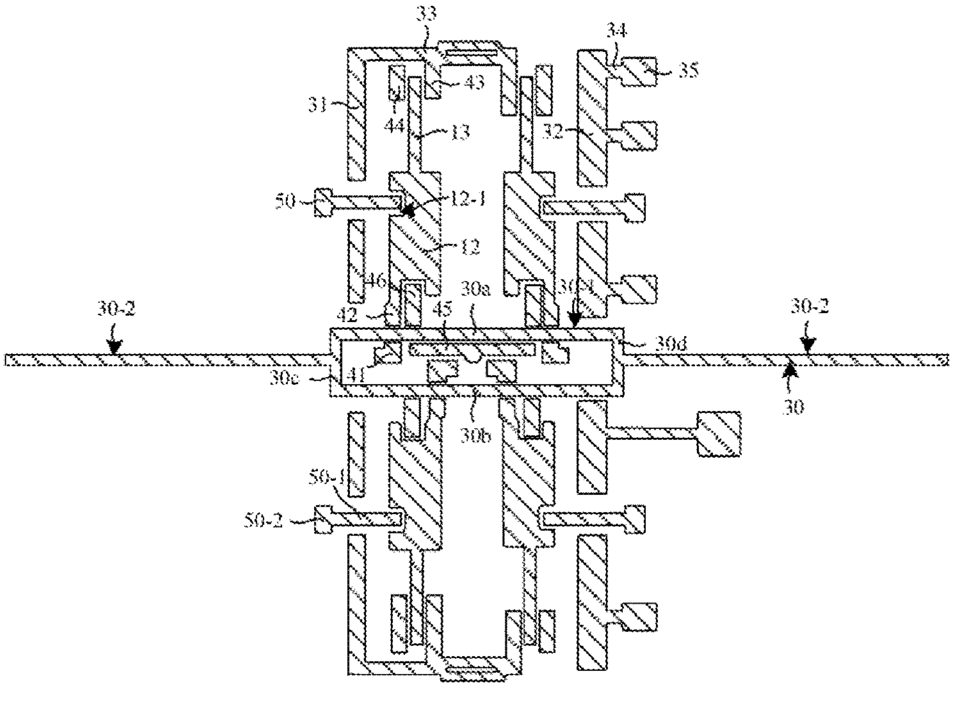

(4) Forming a pattern of a second conductive layer. In an exemplary implementation mode, forming the pattern of the second conductive layer may include: depositing a second conductive thin film on the base substrate on which the aforementioned patterns are formed, and patterning the second conductive thin film through a patterning process, to form a pattern of a second conductive layer on the second insulation layer, as shown in FIGS. 10A and 10B, wherein FIG. 10B is a schematic diagram of the second conductive layer in FIG. 10A. In an exemplary implementation mode, the second conductive layer may be referred to as a gate metal layer (GATE).

In an exemplary implementation mode, the second conductive layer in at least one repetition unit may at least include a scan signal line 30, a first power supply auxiliary line 31, a second power supply auxiliary line 32, a first power supply connection line 33, a second power supply connection line 34, and a first auxiliary electrode 35.

In an exemplary implementation mode, the scan signal line 30 may have a line shape extending along the first direction X, and may be disposed in a middle portion of the repetition unit in the second direction Y, i.e., located between the first sub-pixel P1 and the second sub-pixel P2, and the third sub-pixel P3 and the fourth sub-pixel P4. Regions where the scan signal line 30 is overlapped with multiple first active layers may serve as gate electrodes of multiple first transistors T1, and regions where the scan signal line 30 is overlapped with multiple third active layers may serve as gate electrodes of multiple third transistors T3, so that the scan signal line 30 may control on or off of the first transistors T1 and the third transistors T3.

In an exemplary implementation mode, along the first direction X, the scan signal line 30 may include a double line segment 30-1 and a single line segment 30-2 which are sequentially connected. The double line segment 30-1 may be located in the display region 110 and the single line segment 30-2 may be located in the light transmitting region 120. That is, the display region 110 is provided with two signal lines, while the light transmitting region 120 is provided with only one signal line.

In an exemplary implementation mode, the double line segment 30-1 of the display region 110 may include a first sub-line 30*a* and a second sub-line 30*b* extending along the first direction X, the first sub-line 30*a* and the second sub-line 30*b* are arranged along the second direction Y, and the second sub-line 30*b* may be disposed on a side of the first sub-line 30*a* in the second direction Y. The first sub-line 30*a* may be connected with pixel drive circuits of two sub-pixels in a first pixel row, respectively, and the second sub-line 30*b* may be connected with pixel drive circuits of two sub-pixels in a second pixel row, respectively, thereby achieving a connection between the double line segment 30-1 and multiple pixel drive circuits in the repetition unit.

In an exemplary implementation mode, an orthographic projection of the first sub-line 30*a* on the base substrate is at least partially overlapped with orthographic projections of the first active layer 21 and the third active layer 23 in the first sub-pixel P1 and the second sub-pixel P2 on the base substrate, respectively, and overlapping regions serve as gate electrodes of a first transistor T1 and a third transistor T3, respectively. That is, the first sub-line 30*a* is connected simultaneously with the gate electrode of the first transistor T1 and the gate electrode of the third transistor T3 in the first sub-pixel P1 and the second sub-pixel P2. An orthographic projection of the second sub-line 30*b* on the base substrate is at least partially overlapped with orthographic projections of the first active layer 21 and the third active layer 23 in the third sub-pixel P3 and the fourth sub-pixel P4 on the base substrate, respectively, and overlapping regions serve as gate electrodes of a first transistor T1 and a third transistor T3, respectively. That is, the second sub-line 30*b* is connected simultaneously with the gate electrode of the first transistor T1 and the gate electrode of the third transistor T3 in the third sub-pixel P3 and the fourth sub-pixel P4. Thus, the double line segment 30-1 transmitting a same scan signal may simultaneously control on or off of all first transistors T1 and all third transistors T3 in the four sub-pixels of the repetition unit.

In an exemplary implementation mode, the double line segment 30-1 of the display region 110 may further include a third sub-line 30*c* and a fourth sub-line 30*d*. The third sub-line 30*c* may be connected with ends of the first sub-line 30*a* and the second sub-line 30*b* in an opposite direction of the first direction X, respectively, and the fourth sub-line 30*d* may be connected with ends of the first sub-line 30*a* and the second sub-line 30*b* in the first direction X, respectively, so that the third sub-line 30*c*, the first sub-line 30*a*, the fourth sub-line 30*d*, and the second sub-line 30*b* are sequentially connected to form an annular structure. In an exemplary implementation mode, an annular shape may be a rectangular ring or may be a polygonal ring.

In an exemplary implementation mode, the third sub-line 30*c* may be connected with the single line segment 30-2 of the light transmitting region 120 in the opposite direction of the first direction X of the display region 110, the fourth sub-line 30*d* may be connected with the single line segment 30-2 of the light transmitting region 120 in the first direction X of the display region 110, and the double line segment 30-1 of the display region 110 and the single line segment 30-2 of the light transmitting region 120 constitute a continuous scan signal line 30 extending along the first direction X.

In an exemplary implementation mode, for multiple repetition units sequentially disposed in the first direction X, a double line segment 30-1 and a single line segment 30-2 in each repetition unit may be of an interconnected integral structure, and multiple double line segments 30-1 and multiple single line segments 30-2 in multiple repetition units may be of an interconnected integral structure.

In an exemplary implementation mode, in at least one sub-pixel, one scan signal line 30 may simultaneously control on or off of a first transistor T1 and a third transistor T3 in the sub-pixel.

In an exemplary implementation mode, in at least one pixel row, one scan signal line 30 may simultaneously control on or off of all first transistors T1 and all third transistors T3 in the pixel row.

In an exemplary implementation mode, in at least one repetition unit, one scan signal line 30 may simultaneously control on or off of all first transistors T1 and all third transistors T3 in the repetition unit.

In an exemplary implementation mode, in at least one repetition unit, an orthographic projection of third active layers of an integral structure in two sub-pixels of adjacent pixel rows on the base substrate is at least partially overlapped with an orthographic projection of an annular structure of the scan signal line 30 on the base substrate.

In an exemplary implementation mode, orthographic projections of the first via V1, the fifth via V5, the tenth via V10, and the eleventh via V11 on the base substrate may be within a range of an orthographic projection of a region enclosed by the annular structure of the scan signal line 30 on the base substrate.

In an exemplary implementation mode, a position and a shape of a double line segment 30-1 in the first sub-pixel P1 and a position and a shape of a double line segment 30-1 in the second sub-pixel P2 may be substantially mirror-symmetrical with respect to a vertical reference line, a position and a shape of a double line segment 30-1 in the third sub-pixel P3 and a position and a shape of a double line segment 30-1 in the fourth sub-pixel P4 may be substantially mirror-symmetrical with respect to the vertical reference line, the position and the shape of the double line segment 30-1 in the first sub-pixel P1 and the position and the shape of the double line segment 30-1 in the third sub-pixel P3 may be substantially mirror-symmetrical with respect to a horizontal reference line, and the position and the shape of the double line segment 30-1 in the second sub-pixel P2 and the position and the shape of the double line segment 30-1 in the fourth sub-pixel P4 may be substantially mirror-symmetrical with respect to the horizontal reference line.

In an exemplary implementation mode, the first power supply auxiliary line 31 may have a strip shape extending along the second direction Y, and may be respectively disposed in the first sub-pixel P1 and the third sub-pixel P3 and located on a side of the second electrode plate 12 in an opposite direction of the first direction X. The first power supply auxiliary line 31 is connected with the first power supply line 51 through multiple twelfth vias V12, and the first power supply auxiliary line 31 and the first power supply line 51 form a double-layer trace structure, which may not only ensure reliability of power supply signal transmission, but also effectively reduce a resistance of a first power supply line, and effectively reduce voltage drop of a first power supply signal, thereby improving a display effect. In an exemplary implementation mode, there may be multiple first power supply auxiliary lines 31 in the first sub-pixel P1 and the third sub-pixel P3, and the multiple first power supply auxiliary lines 31 may be disposed at intervals along the second direction Y.

In an exemplary implementation mode, the second power supply auxiliary line 32 may have a strip shape extending along the second direction Y, and may be respectively disposed in the second sub-pixel P2 and the fourth sub-pixel P4 and located on a side of the second electrode plate 12 in the first direction X, the second power supply auxiliary line 32 is connected with the second power supply line 52 through multiple thirteenth vias V13, and the second power supply auxiliary line 32 and the second power supply line 52 form a double-layer trace structure, which may not only ensure reliability of power supply signal transmission, but also effectively reduce a resistance of a second power supply line, and effectively reduce voltage drop of a second power supply signal, thereby improving a display effect. In an exemplary implementation mode, there may be multiple second power supply auxiliary lines 32 in the second sub-pixel P2 and the fourth sub-pixel P4, and the multiple second power supply auxiliary lines 32 may be disposed at intervals along the second direction Y.

In an exemplary implementation mode, the first power supply connection line 33 may have a strip shape extending along the first direction X, and a main body portion of the first power supply connection line 33 may be respectively disposed in the first sub-pixel P1 and the third sub-pixel P3, and may be located on a side of a first electrode plate 11 of a present sub-pixel away from the scan signal line 30. In the first sub-pixel P1, a first end of the first power supply connection line 33 is connected with a first power supply auxiliary line 31 in the first sub-pixel P1, and a second end of the first power supply connection line 33 extends along the first direction X to the second sub-pixel P2. The first power supply auxiliary line 31 is configured to be connected with third connection electrodes in the first sub-pixel P1 and the second sub-pixel P2, respectively. In the third sub-pixel P3, a first end of the first power supply connection line 33 is connected with a first power supply auxiliary line 31 in the third sub-pixel P3, and a second end of the first power supply connection line 33 extends along the first direction X to the fourth sub-pixel P4. The first power supply auxiliary line 31 is configured to be connected with third connection electrodes in the third sub-pixel P3 and the fourth sub-pixel P4, respectively.

In an exemplary implementation mode, the first power supply connection line 33 may achieve a one-drag-four structure of a first power supply line in one repetition unit, which saves a quantity of signal lines, reduces occupied space, has a simple structure and a reasonable layout, makes full use of layout space, improves a space utilization rate, and is beneficial to improving a resolution and transparency.

In an exemplary implementation mode, in an overlapping region of the first power supply connection line 33 and the compensation signal line 54, a strip-shaped opening (through hole) extending along the first direction X may be disposed on the first power supply connection line 33, so that the region forms an annular structure to reduce an overlapping area of the first power supply connection line 33 with the data signal line 53 and the compensation signal line 54, and reduce a parasitic capacitance between signal lines, thereby improving a display effect.

In an exemplary implementation mode, a first power supply connection line 33 and at least one first power supply auxiliary line 31 in the first sub-pixel P1 may be of an interconnected integral structure, and a first power supply connection line 33 and at least one first power supply auxiliary line 31 in the third sub-pixel P3 may be of an interconnected integral structure.

In an exemplary implementation mode, the second power supply connection line 34 and the first auxiliary electrode 35 may be disposed in the light transmitting region 120 of the repetition unit. The second power supply connection line 34 may have a strip shape extending along the first direction X, a first end of the second power supply connection line 34 is connected with the second power supply auxiliary line 32, and a second end of the second power supply connection line 34 is connected with the first auxiliary electrode 35 after extending toward a direction of the light transmitting region 120. The first auxiliary electrode 35 may have a block shape (e.g., a rectangular shape) and is configured to be connected with a subsequently formed second auxiliary electrode. Since the second auxiliary electrode is configured to be connected with a subsequently formed third electrode, a connection between the second power supply line 52 with the third electrode may be achieved.

In an exemplary implementation mode, three second power supply connection lines 34 and first auxiliary electrodes 35 may be disposed in the light transmitting region 120 on a side of the second sub-pixel P2 in the first direction X, and two second power supply connection lines 34 and first auxiliary electrodes 35 may be disposed in the light transmitting region 120 on a side of the fourth sub-pixel P4 in the first direction X.

In an exemplary implementation mode, extension lengths of multiple second power supply connection lines 34 in the first direction X may be the same or different, and areas of multiple first auxiliary electrodes 35 may be the same or different.

In an exemplary implementation mode, the second power supply auxiliary line 32 and the first auxiliary electrode 35 connected through the second power supply connection line 34 may be of an interconnected integral structure.

In an exemplary implementation mode, considering a problem of voltage drop (IR Drop) existing in large-size transparent display, according to an embodiment of the present disclosure, a second power supply line for transmitting a low-voltage signal is pertinently disposed in each repetition unit, and the second power supply line is connected with a third electrode in a subsequently formed light emitting structure layer through an auxiliary electrode, which may effectively reduce voltage drop of a second power supply signal, effectively solve the problem of voltage drop existing in the large-size transparent display, and ensure uniformity of display.

In an exemplary implementation mode, positions and shapes of a first power supply auxiliary line 31 and a first power supply connection line 33 in the first sub-pixel P1 and positions and shapes of a first power supply auxiliary line 31 and a first power supply connection line 33 in the third sub-pixel P3 may be substantially mirror-symmetrical with respect to a horizontal reference line, and a position and a shape of a second power supply auxiliary line 32 in the second sub-pixel P2 and a position and a shape of a second power supply auxiliary line 32 in the fourth sub-pixel P4 may be substantially mirror-symmetrical with respect to the horizontal reference line. The position of the first power supply auxiliary line 31 in the first sub-pixel P1 and the position of the second power supply auxiliary line 32 in the second sub-pixel P2 may be substantially mirror-symmetrical with respect to a vertical reference line, and the position of the first power supply auxiliary line 31 in the third sub-pixel P3 and the position of the second power supply auxiliary line 32 in the fourth sub-pixel P4 may be substantially mirror-symmetrical with respect to the vertical reference line.

In an exemplary implementation mode, the second conductive layer of each sub-pixel in the display substrate may at least include a second electrode plate 12, a second gate electrode 13, a first connection electrode 41, a second connection electrode 42, a third connection electrode 43, a fourth connection electrode 44, a fifth connection electrode 45, a sixth connection electrode 46, and an electrode plate connection electrode 50.

In an exemplary implementation mode, the second electrode plate 12 may have a rectangular shape, and corners of the rectangular shape may be provided with chamfers, protrusions, or openings. The second electrode plate 12 may be disposed at a position of each sub-pixel close to the scan signal line 30, and an orthographic projection of the second electrode plate 12 on the base substrate is at least partially overlapped with an orthographic projection of the first electrode plate 11 on the base substrate. The second electrode plate 12 may serve as an upper electrode plate of a storage capacitor (a first end of the storage capacitor), and the first electrode plate 11 and the second electrode plate 12 form a storage capacitor of a pixel drive circuit.

In an exemplary implementation mode, the second gate electrode 13 may have a strip shape extending along the second direction Y, may be located on a side of a second electrode plate 12 of a present sub-pixel away from the scan signal line 30, a first end of the second gate electrode 13 is connected with a second electrode plate 12 of the present sub-pixel, a second end of the second gate electrode 13 extends along a direction away from the scan signal line 30, and an orthographic projection of the second gate Electrode 13 on the base substrate is at least partially overlapped with an orthographic projection of a second active layer 22 on the base substrate. The second gate electrode 13 may serve as a gate electrode of a second transistor T2, which may control on or off of the second transistor T2.

In an exemplary implementation mode, a second electrode plate 12 and a second gate electrode 13 in each sub-pixel may be of an interconnected integral structure.

In an exemplary implementation mode, the first connection electrode 41 may have a block shape (e.g., a rectangular shape), a first end of the first connection electrode 41 is connected with a first region of a first active layer through the first via V1, and a second end of the first connection electrode 41 is connected with a data signal line 53 through the tenth via V10. In an exemplary implementation mode, the first connection electrode 41 may serve as a first electrode of the first transistor T1, which achieves that the data signal line 53 writes a data signal into the first electrode of the first transistor T1.

In an exemplary implementation mode, four data signal lines 53 may include a first data signal line, a second data signal line, a third data signal line, and a fourth data signal line. The first data signal line may be located on a side of the first power supply line 51 in the first direction X, and may be connected with a first region of a first active layer in the first sub-pixel P1 through the first via V1. The second data signal line may be located on a side of the compensation signal line 54 in an opposite direction of the first direction X, and may be connected with a first region of a first active layer in the third sub-pixel P3 through the first via V1. The third data signal line may be located on a side of the compensation signal line 54 in the first direction X and may be connected with a first region of a first active layer in the fourth sub-pixel P4 through the first via V1. The fourth data signal line may be located on a side of the second power supply line 52 in the opposite direction of the first direction X, and may be connected with a first region of a first active layer in the second sub-pixel P2 through the first via V1.

In an exemplary implementation mode, the second connection electrode 42 may have a block shape (such as a rectangular shape), a first end of the second connection electrode 42 is connected with a second region of a first active layer through the second via V2, and a second end of the second connection electrode 42 is connected with the second electrode plate 12. In an exemplary implementation mode, the second connection electrode 42 may serve as a second electrode of the first transistor T1 such that the second electrode of the first transistor T1 and the second electrode plate 12 have a same potential.

In an exemplary implementation mode, the second connection electrode 42 and the second electrode plate 12 may be of an interconnected integral structure.

In an exemplary implementation mode, since the second gate electrode 13 is connected with the second electrode plate 12 and the second electrode of the first transistor T1 is connected with the second electrode plate 12, it is achieved that the second electrode of the first transistor T1, a gate electrode of the second transistor T2, and the second electrode plate 12 have a same potential, thereby forming a first node N1 of the pixel drive circuit.

In an exemplary implementation mode, the third connection electrode 43 may have a strip shape extending along the second direction Y, a first end of the third connection electrode 43 is connected with a first region of a second active layer through the third via V3, and a second end of the third connection electrode 43 is connected with the first power supply connection line 33. In an exemplary implementation mode, the third connection electrode 43 may serve as a first electrode of the second transistor T2. Since the first power supply connection line 33 is connected with the first power supply auxiliary line 31 and the first power supply auxiliary line 31 is connected with the first power supply line 51, it is achieved that the first power supply line 51 writes a first power supply signal into the first electrode of the second transistor T2.

In an exemplary implementation mode, a third connection electrode 43 of the first sub-pixel P1, a third connection electrode 43 of the second sub-pixel P2, and a connected first power supply connection line 33 may be of an interconnected integral structure. A third connection electrode 43 of the third sub-pixel P3, a third connection electrode 43 of the fourth sub-pixel P4, and a connected first power supply connection line 33 may be of an interconnected integral structure.

In an exemplary implementation mode, the fourth connection electrode 44 may have a strip shape extending along the second direction Y, a first end of the fourth connection electrode 44 is connected with a second region of a second active layer through the fourth via V4, and a second end of the fourth connection electrode 44 is connected with the first electrode plate 11 through the seventh via V7. In an exemplary implementation mode, the fourth connection electrode 44 may serve as a second electrode of the second transistor T2, so that the second electrode of the second transistor T2 and the first electrode plate 11 have a same potential.

In an exemplary implementation mode, the fifth connection electrode 45 may have a strip shape extending along the first direction X, a first end of the fifth connection electrode 45 is connected with a first region of a third active layer through the fifth via V5, and a second end of the fifth connection electrode 45 is connected with the compensation signal line 54 through the eleventh via V11. In an exemplary implementation mode, the fifth connection electrode 45 may serve as a first electrode of the third transistor T3, which achieves that the compensation signal line 54 writes a compensation signal into the first electrode of the third transistor T3.

In an exemplary implementation mode, since third active layers 23 of two adjacent sub-pixels in the second direction Y in one pixel column are of an interconnected integral structure, the two sub-pixels share a first region of a third active layer, and thus the two sub-pixels share one fifth connection electrode 45.

In an exemplary implementation mode, fifth connection electrodes 45 of two pixel columns may be of an interconnected integral structure, and the fifth connection electrodes 45 of the two pixel columns constitute a compensation connection line, that is, four pixel drive circuits in one display region 110 share one compensation connection line, achieving a one-drag-four structure of a compensation signal line in one repetition unit. In the display substrate of the present disclosure, a compensation signal line is designed to have a one-drag-four structure, which saves a quantity of signal lines, reduces occupied space, has a simple structure and a reasonable layout, makes full use of layout space, improves a space utilization rate, and is beneficial to improving a resolution and transparency.

In an exemplary implementation mode, since a compensation signal line 54 is disposed between a first pixel column and a second pixel column, the compensation signal line 54 is connected with third transistors T3 in the first pixel column and the second pixel column through a fifth connection electrode 45, respectively, and the third transistor T3 of the first pixel column and the third transistor T3 of the second pixel column are symmetrically disposed with respect to the compensation signal line 54. Thus such a symmetrical structure may ensure that a Resistor-Capacitor (RC) delay of writing a compensation signal into a third transistor T3 is substantially the same, thereby ensuring display uniformity.

In an exemplary implementation mode, orthographic projections of the first connection electrode 41 and the fifth connection electrode 45 in the repetition unit on the base substrate may be within a range of an orthographic projection of a region enclosed by the annular structure of the scan signal line 30 on the base substrate.

In an exemplary implementation mode, the sixth connection electrode 46 may have a strip shape extending along the second direction Y, a first end of the sixth connection electrode 46 is connected with a second region of a third active layer through the sixth via V6, and a second end of the sixth connection electrode 43 is connected with the first electrode plate 11 through the eighth via V8. In an exemplary implementation mode, the sixth connection electrode 46 may serve as a second electrode of the third transistor T3, so that the second electrode of the third transistor T3 and the first electrode plate 11 have a same potential.

In an exemplary implementation mode, the fourth connection electrode 44 and the sixth connection electrode 46 enable the second electrode of the second transistor T2, the second electrode of the third transistor T3, and the first electrode plate 11 to have a same potential, thereby forming a second node N2 of the pixel drive circuit.

In an exemplary implementation mode, the electrode plate connection electrode 50 may have a strip shape extending along the first direction X, a first end of the electrode plate connection electrode 50 is connected with the first electrode plate 11 through the ninth via V9, a second end of the electrode plate connection electrode 50 extends along a direction away from the compensation signal line 54, and the second end of the electrode plate connection electrode 50 is configured to be connected with a subsequently formed first electrode.

In an exemplary implementation mode, electrode plate connection electrodes 50 in the first sub-pixel P1 and the third sub-pixel P3 span the first power supply line 51 disposed on a side of the display region 110, and an orthographic projection of an electrode plate connection electrode 50 on the base substrate is at least partially overlapped with an orthographic projection of the first power supply line 51 on the base substrate.

In an exemplary implementation mode, electrode plate connection electrodes 50 in the second sub-pixel P2 and the fourth sub-pixel P4 span the second power supply line 52 disposed on a side of the display region 110, and an orthographic projection of an electrode plate connection electrode 50 on the base substrate is at least partially overlapped with an orthographic projection of the second power supply line 52 on the base substrate.

In an exemplary implementation mode, the electrode plate connection electrode 50 may at least include a first sub-connection electrode 50-1 and a second sub-connection electrode 50-2 connected with each other, the first sub-connection electrode 50-1 may have a strip shape extending along the first direction X, and the second sub-connection electrode 50-2 may have a block shape (e.g., a rectangular shape). In an exemplary implementation mode, a first end of the first sub-connection electrode 50-1 is connected with the first electrode plate 11 through the ninth via V9, a second end of the first sub-connection electrode 50-1 is connected with the second sub-connection electrode 50-2 after spanning the first power supply line 51 or the second power supply line 52 along a direction away from the first electrode plate 11, and the second sub-connection electrode 50-2 is configured to be connected with a subsequently formed first electrode.

In an exemplary implementation mode, the first sub-connection electrode 50-1 and the second sub-connection electrode 50-2 may be disposed in a same layer and are of an interconnected integral structure.

In an exemplary implementation mode, a side of the second electrode plate 12 close to the light transmitting region 120 (away from the compensation signal line 54) may be provided with an electrode plate groove 12-1 that may have a block shape (e.g., a rectangular shape). The ninth via V9 may be accommodated within the electrode plate groove 12-1. An orthographic projection of the ninth via V9 on the base substrate is within a range of an orthographic projection of the electrode plate groove 12-1 on the base substrate, and the first end of the first sub-connection electrode 50-1 is also disposed in the electrode plate groove 12-1.

In an exemplary implementation mode, for the second electrode plate 12, the second gate electrode 13, the first connection electrode 41 to the sixth connection electrode 46, and the electrode plate connection electrode 50, positions of various patterns in the first sub-pixel P1 and positions of various patterns in the third sub-pixel P3 may be substantially mirror-symmetrical with respect to a horizontal reference line, positions of various patterns in the second sub-pixel P2 and positions of various patterns in the fourth sub-pixel P4 may be substantially mirror-symmetrical with respect to the horizontal reference line, the positions of the various patterns in the first sub-pixel P1 and the positions of the various patterns in the second sub-pixel P2 may be substantially mirror-symmetrical with respect to a vertical reference line, and the positions of the various patterns in the third sub-pixel P3 and the positions of the various patterns in the fourth sub-pixel P4 may be substantially mirror-symmetrical with respect to the vertical reference line.

In an exemplary implementation mode, there is a distance between an end of each connection electrode connected with the semiconductor layer and an edge of a corresponding via, i.e., the connection electrode does not fully cover the via.

In an exemplary implementation mode, in a process of forming the pattern of the second conductive layer, the pattern of the second conductive layer is first formed by using a wet etching process, then using a self-alignment process with the second conductive layer as a mask, the second insulation layer in a region outside the second conductive layer is etched by using a dry etching process, and then a conductorization treatment for a second time is performed on the exposed semiconductor layer while etching away the second insulation layer.

In an exemplary implementation mode, during the conductorization treatment for the second time, an edge portion of the semiconductor layer covered by the second conductive layer is also conductorized, that is, the semiconductor layer conductorized for the second time will extend to a region that is conductorized for the first time, and an overlapping region of the region conductorized for the first time and a region conductorized for the second time forms a region conductorized twice, so as to ensure reliable connection between the second conductive layer and the semiconductor layer.

After this patterning process, the film layer of the light transmitting region 120 may include the first insulation layer, the second insulation layer, and a single line segment disposed on the second insulation layer.

Figure 11:
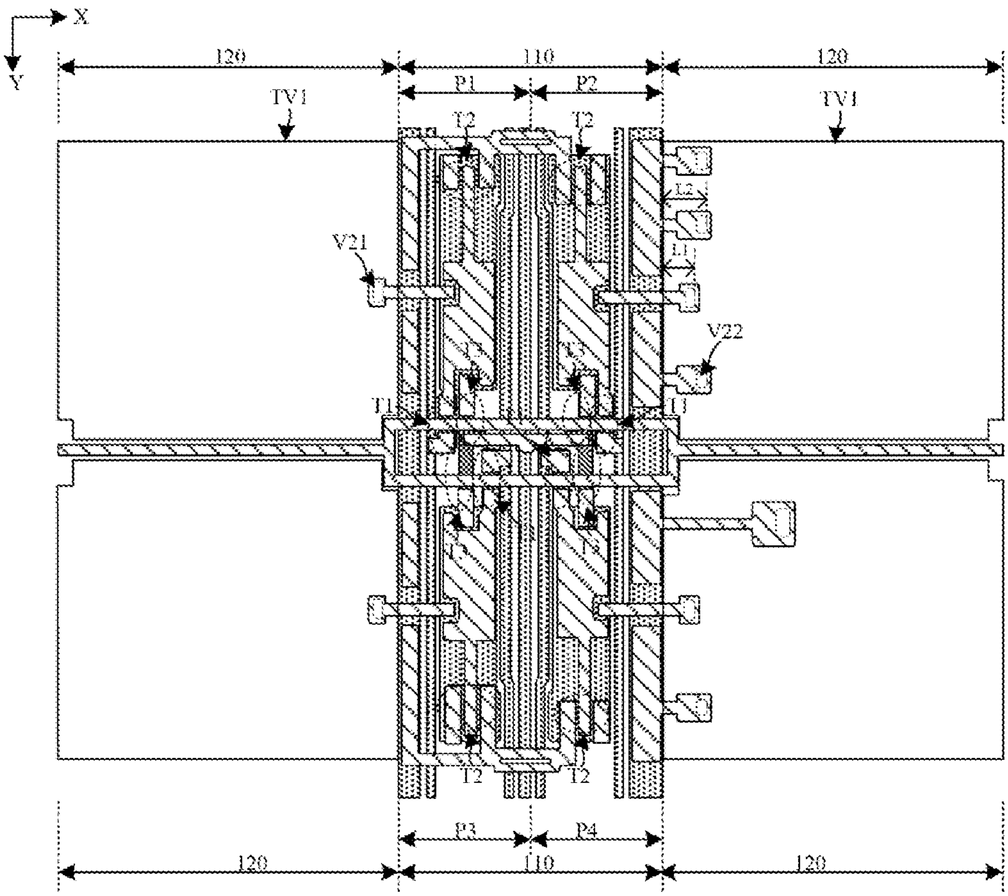
FIG. 11 is a schematic diagram after forming a third insulation layer and a pattern of a planarization layer according to an embodiment of the present disclosure.

(5) Forming a third insulation layer and a pattern of a planarization layer. In an exemplary implementation mode, forming the third insulation layer and the pattern of the planarization layer may include: first depositing a third insulation thin film on the base substrate on which the aforementioned patterns are formed, then coating a planarization thin film, and then patterning the third insulation thin film and the planarization thin film through a patterning process, to form a third insulation layer covering the second conductive layer and a pattern of a planarization layer disposed on the third insulation layer, wherein the planarization layer is provided with a planarization opening, and the third insulation layer is provided with multiple vias, as shown in FIG. 11.

In an exemplary implementation mode, the planarization layer covers a region where the single line segment is located in the display region 110 and the light transmitting region 120. The planarization opening TV1 may be located in a region outside the single line segment in the light transmitting region 120, and the planarization thin film within the planarization opening TV1 is removed to expose the third insulation layer.

In an exemplary implementation mode, the planarization opening TV1 may have a rectangular shape, corners of the rectangular shape may be provided with grooves or chamfers, and a first auxiliary electrode 35 in each sub-pixel and the second sub-connection electrode 50-2 in the electrode plate connection electrode 50 may be located within a range of the planarization opening TV1.

In an exemplary implementation mode, multiple vias of at least one repetition unit may at least include four twenty-first vias V21 and six twenty-second vias V22.

In an exemplary implementation mode, an orthographic projection of a twenty-first via V21 on the base substrate is located within a range of an orthographic projection of the second sub-connection electrode 50-2 in the electrode plate connection electrode 50 on the base substrate, the third insulation layer within the twenty-first via V21 is etched away to expose a surface of the second sub-connection electrode 50-2, and the twenty-first via V21 is configured such that a subsequently formed first electrode is connected with the second sub-connection electrode 50-2 through the via.

In an exemplary implementation mode, the twenty-first via V21 serves as a second electrode plate via of the present disclosure, and an orthographic projection of the twenty-first via V21 on the base substrate is within a range of an orthographic projection of the planarization opening TV1 on the base substrate.

In an exemplary implementation mode, an area of an orthographic projection of the twenty-first via V21 on the base substrate may be larger than an area of an orthographic projection of the ninth via V9 on the base substrate.

In an exemplary implementation mode, the twenty-second via V22 may be disposed in the light transmitting region 120, an orthographic projection of the twenty-second via V22 on the base substrate is within a range of an orthographic projection of the first auxiliary electrode 35 on the base substrate, the third insulation layer within the twenty-second via V22 is etched away to expose a surface of the first auxiliary electrode 35, and the twenty-second via V22 is configured such that a subsequently formed second auxiliary electrode is connected with the first auxiliary electrode 35 through the via.

In an exemplary implementation mode, the twenty-second via V22 serves as an auxiliary electrode via of the present disclosure, and an orthographic projection of the twenty-second via V22 on the base substrate is within a range of an orthographic projection of the planarization opening TV1 on the base substrate.

In an exemplary implementation mode, an area of an orthographic projection of the twenty-second via V22 (i.e., the auxiliary electrode via) on the base substrate may be larger than an area of an orthographic projection of the twenty-first via V21 (i.e., the second electrode plate via) on the base substrate.

In an exemplary implementation mode, there is a first distance L1 between an edge of the twenty-first via V21 away from the second power supply line 52 and an edge of the second power supply line 52 close to the twenty-first via V21, there is a second distance L2 between an edge of at least one twenty-second via V22 away from the second power supply line 52 and an edge of the second power supply line 52 close to the twenty-second via V22, and the first distance L1 may be smaller than the second distance L2.

In an exemplary implementation mode, a Half Tone Mask process may be adopted for this patterning process.

After this patterning process, a main film layer of the light transmitting region 120 includes the first insulation layer, the second insulation layer, and the third insulation layer.

Figure 12A:
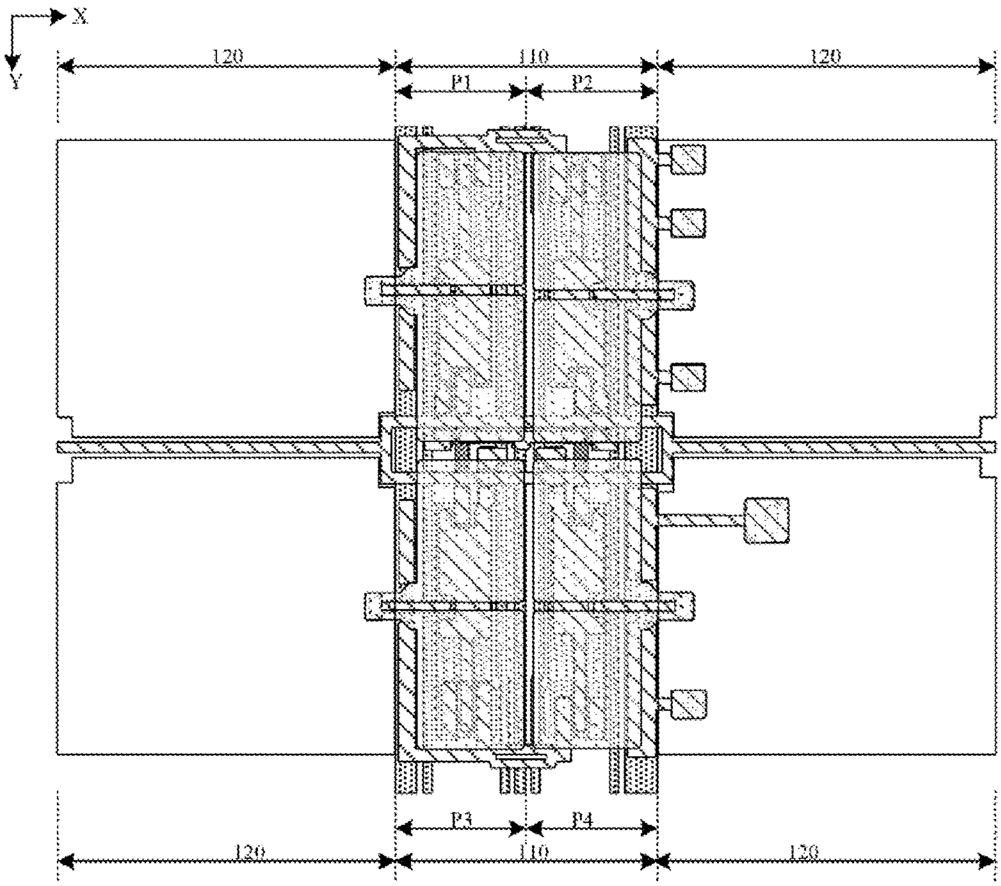
FIGS. 12A and 12B are schematic diagrams after forming a pattern of a third conductive layer according to an embodiment of the present disclosure.
Figure 12B:
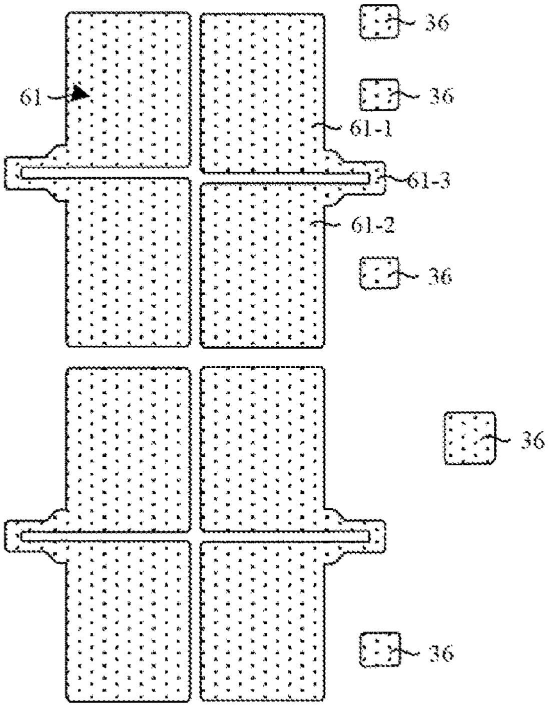

(6) Forming a pattern of a third conductive layer. In an exemplary implementation mode, forming the pattern of the third conductive layer may include: depositing a third conductive thin film on the base substrate on which the aforementioned patterns are formed, and patterning the third conductive thin film through a patterning process to form a pattern of a third conductive layer, as shown in FIGS. 12A and 12B, wherein FIG. 12B is a schematic diagram of the third conductive layer in FIG. 12A.

In an exemplary implementation mode, the third conductive layer of each sub-pixel in the display substrate may at least include a first electrode 61, and the first electrode 61 may include a first sub-electrode 61-1, a second sub-electrode 61-2, and a sub-connection electrode 61-3. In an exemplary implementation mode, the first electrode 61 may serve as one electrode of an anode of a light emitting device.

In an exemplary implementation mode, on the planarization layer of the display region 110, the first sub-electrode 61-1 and the second sub-electrode 61-2 are disposed in isolation, the first sub-electrode 61-1 and the second sub-electrode 61-2 may have rectangular shapes, and may be sequentially disposed along the second direction Y.

In an exemplary implementation mode, a main body portion of the sub-connection electrode 61-3 may be disposed on the third insulation layer. The sub-connection electrode 61-3 may have a "C" shape. A first end of the sub-connection electrode 61-3 is connected with the first sub-electrode 61-1, a second end of the sub-connection electrode 61-3 is connected with the second sub-electrode 61-2, and a region between the first end and the second end is connected with the second sub-connection electrode 50-2 in the electrode plate connection electrode through the twenty-first via V21. In an exemplary implementation mode, the sub-connection electrode 61-3 achieves a mutual connection between the first sub-electrode 61-1 and the second sub-electrode 61-2. Since the sub-connection electrode 61-3 is connected with the electrode plate connection electrode 50, and the electrode plate connection electrode 50 is connected with the first electrode plate 11, it is achieved that the first electrode 61 and the first electrode plate 11 of the storage capacitor have a same potential.

In an exemplary implementation mode, when a bright spot defect occurs on the display substrate, the sub-connection electrode 61-3 may be truncated through a laser cutting manner, so that one of the first sub-electrode 61-1 and the second sub-electrode 61-2 is connected with the first electrode plate 11 while the other is floating, thus the bright spot defect may be repaired.

In an exemplary implementation mode, the twenty-first via V21 serves as the second electrode plate via of the present disclosure, and an orthographic projection of the twenty-first via V21 on the base substrate is not overlapped with orthographic projections of the first sub-electrode 61-1 and the second sub-electrode 61-2 on the base substrate, which may not only improve a success rate of repairing the bright spot defect and avoid an influence of repairing on the pixel drive circuit, but also may ensure flatness of the first electrode, improve light output quality of the light emitting device, and improve a display effect.

In an exemplary implementation mode, four first electrodes 61 in one repetition unit may be arranged in a square, an upper left first electrode 61 is connected with a pixel drive circuit in the first sub-pixel P1, an upper right first electrode 61 is connected with a pixel drive circuit in the second sub-pixel P2, a lower left first electrode 61 is connected with a pixel drive circuit in the third sub-pixel P3, and a lower right first electrode 61 is connected with a pixel drive circuit in the fourth sub-pixel P4. In some possible implementation modes, an arrangement mode of first electrodes may be adjusted according to actual needs, which is not specifically limited herein in the present disclosure.

In an exemplary implementation mode, a first sub-electrode 61-1, a second sub-electrode 61-2, and a sub-connection electrode 61-3 of each sub-pixel may be of an interconnected integral structure.

In an exemplary implementation mode, the third conductive layer of at least one repetition unit may further include a second auxiliary electrode 36. Multiple second auxiliary electrodes 36 may be disposed in the light transmitting region 120 on a side of the second sub-pixel P2 and the fourth sub-pixel P4 in the first direction X. The second auxiliary electrode 36 may have a rectangular shape, and an orthographic projection of the second auxiliary electrode 36 on the base substrate is at least partially overlapped with an orthographic projection of the first auxiliary electrode 35 on the base substrate. The second auxiliary electrode 36 may be connected with the first auxiliary electrode 35 through the twenty-second via V22, and the second auxiliary electrode 36 is configured to be connected with a subsequently formed third auxiliary electrode.

In an exemplary implementation mode, the third conductive layer may be made of a transparent conductive material, such as Indium Tin Oxide (ITO) or Indium Zinc Oxide (IZO).

After this patterning process, the main film layer of the light transmitting region 120 does not change.

Figure 13A:
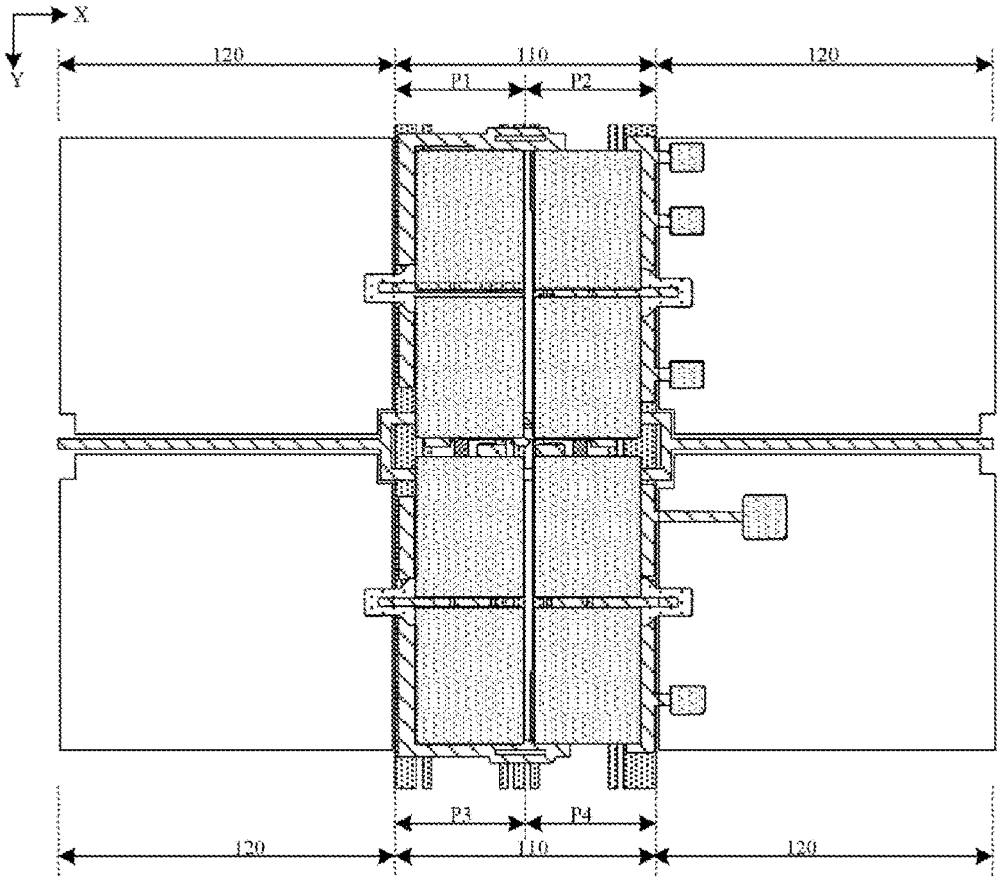
FIGS. 13A and 13B are schematic diagrams after forming a pattern of a fourth conductive layer according to an embodiment of the present disclosure.
Figure 13B:
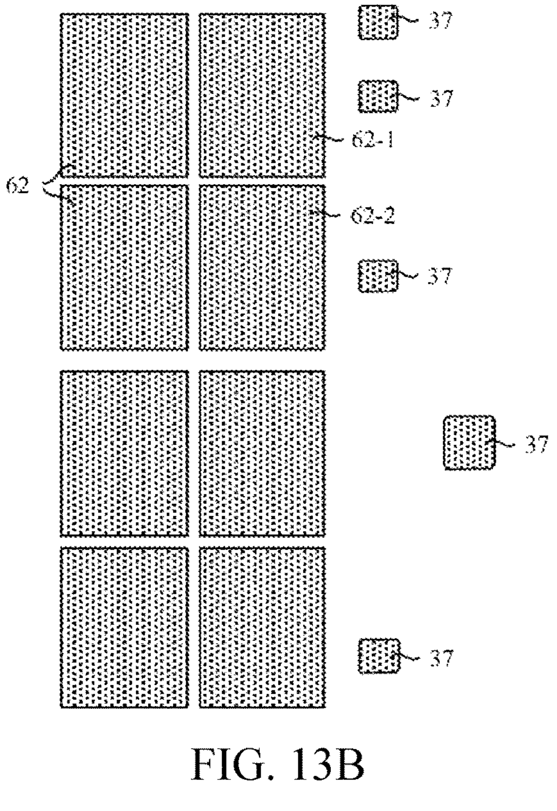

(7) Forming a pattern of a fourth conductive layer. In an exemplary implementation mode, forming the pattern of the fourth conductive layer may include: depositing a fourth conductive thin film on the base substrate on which the aforementioned patterns are formed, patterning the fourth conductive thin film through a patterning process, to form a pattern of a fourth conductive layer, as shown in FIGS. 13A and 13B, wherein FIG. 13B is a schematic diagram of the fourth conductive layer in FIG. 13A.

In an exemplary implementation mode, the fourth conductive layer of each sub-pixel in the display substrate may at least include a second electrode 62. In an exemplary implementation mode, the second electrode 62 may serve as another electrode of the anode of the light emitting device.

In an exemplary implementation mode, the second electrode 62 may be disposed on the first sub-electrode 61-1 and the second sub-electrode 61-2 in the first electrode 61 of the display region 110. A second electrode 62 in at least one sub-pixel may include a third sub-electrode 62-1 and a fourth sub-electrode 62-2 which are disposed in isolation, the third sub-electrode 62-1 and the fourth sub-electrode 62-2 may have rectangular shapes, and may be sequentially disposed along the second direction Y.

In an exemplary implementation mode, an orthographic projection of the third sub-electrode 62-1 on the base substrate is at least partially overlapped with an orthographic projection of the first sub-electrode 61-1 on the base substrate, and the third sub-electrode 62-1 is directly lapped with the first sub-electrode 61-1. An orthographic projection of the fourth sub-electrode 62-2 on the base substrate is at least partially overlapped with an orthographic projection of the second sub-electrode 61-2 on the base substrate, and the fourth sub-electrode 62-2 is directly lapped with the second sub-electrode 61-2.

In an exemplary implementation mode, the fourth conductive layer of at least one repetition unit may further include a third auxiliary electrode 37. Multiple third auxiliary electrodes 37 may be disposed in the light transmitting region 120 on a side of the second sub-pixel P2 and the fourth sub-pixel P4 in the first direction X. The third auxiliary electrode 37 may have a rectangular shape, and may be disposed on the second auxiliary electrode 36. An orthographic projection of the third auxiliary electrode 37 on the base substrate is at least partially overlapped with an orthographic projection of the second auxiliary electrode 36 on the base substrate, and the third auxiliary electrode 37 is directly lapped with the second auxiliary electrode 36. In an exemplary implementation mode, the third auxiliary electrode 37 is configured to be connected with a subsequently formed third electrode.

In an exemplary implementation mode, a post spacer (RIB) structure may be adopted for the third auxiliary electrode 37, and a cross-sectional shape of the third auxiliary electrode 37 may be an inverted trapezoid, so that a subsequently formed organic emitting layer may be disconnected at a side edge of the third auxiliary electrode 37 to form an independent and isolated organic light emitting block, which effectively avoids interference of the organic light emitting block on outgoing light, and improves quality of the outgoing light, thereby facilitating improvement of display quality.

In an exemplary implementation mode, the first auxiliary electrode 35, the second auxiliary electrode 36, and the third auxiliary electrode 37 which are stacked constitute an auxiliary electrode.

In an exemplary implementation mode, the fourth conductive layer may be made of a transparent conductive material, such as Indium Tin Oxide (ITO) or Indium Zinc Oxide (IZO).

After this patterning process, the main film layer of the light transmitting region 120 does not change.

Figure 14:
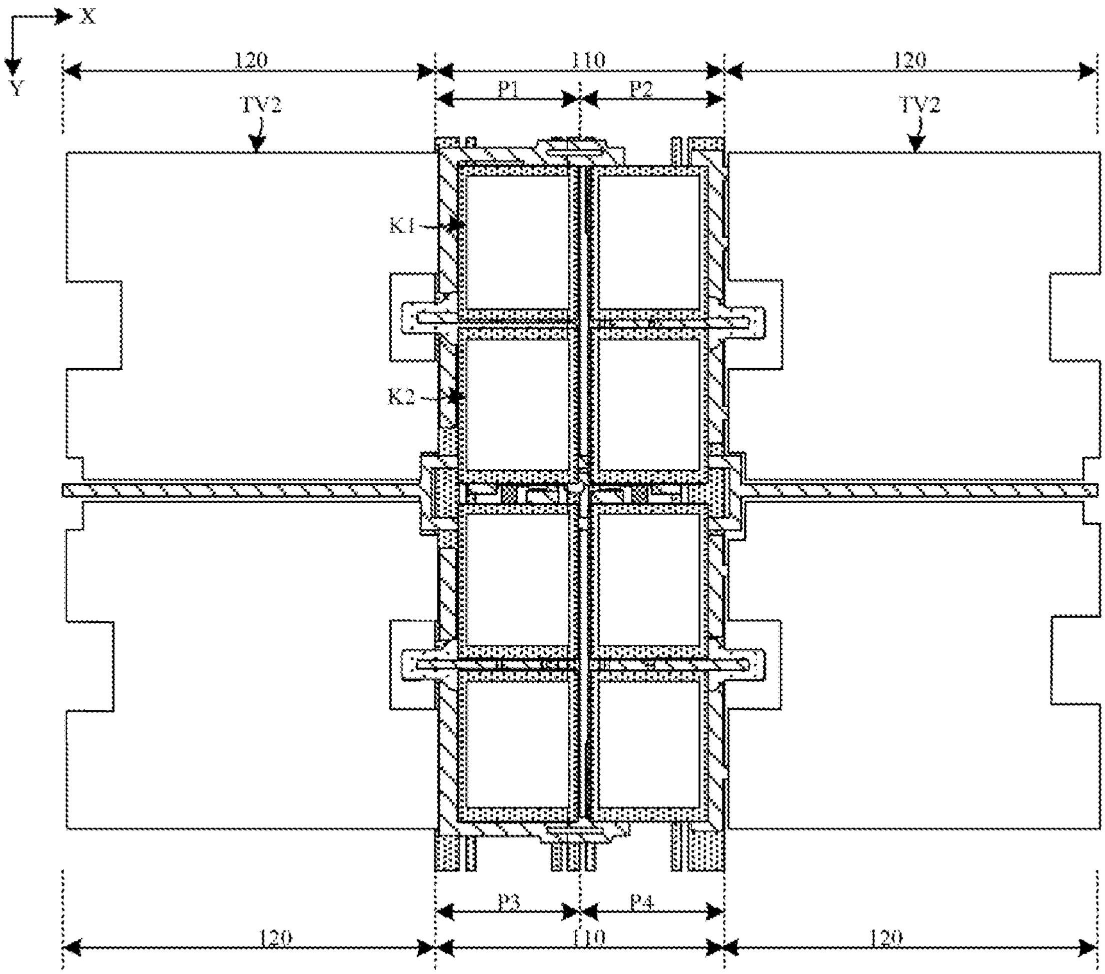
FIG. 14 is a schematic diagram after forming a pattern of a pixel definition layer according to an embodiment of the present disclosure.

(8) Forming a pixel definition layer. In an exemplary implementation mode, forming the pattern of the pixel definition layer may include: coating a pixel definition thin film on the base substrate on which the aforementioned patterns are formed, and patterning the pixel definition thin film through a patterning process, to form a pixel definition layer, as shown in FIG. 14.

In an exemplary implementation mode, in at least one repetition unit, a main portion of the pixel definition layer covers the display region 110. The pixel definition layer is at least provided with a first pixel opening K1, a second pixel opening K2, and a light transmitting opening TV2.

In an exemplary implementation mode, the first pixel opening K1 and the second pixel opening K2 may be disposed in each sub-pixel. An orthographic projection of the first pixel opening K1 on the base substrate is within a range of an orthographic projection of the third sub-electrode 62-1 in the second electrode 62 on the base substrate, and the pixel definition thin film within the first pixel opening K1 is removed to expose a portion of a surface of the third sub-electrode 62-1. An orthographic projection of the second pixel opening K2 on the base substrate is within a range of an orthographic projection of the fourth sub-electrode 62-2 in the second electrode 62 on the base substrate, and the pixel definition thin film within the second pixel opening K2 is removed to expose a portion of a surface of the fourth sub-electrode 62-2.

In an exemplary implementation mode, in a plane parallel to the base substrate, shapes of the first pixel opening K1 and the second pixel opening K2 may be similar to shapes of sub-electrodes, and in a plane perpendicular to the base substrate, cross-sectional shapes of the first pixel opening K1 and the second pixel opening K2 may be rectangles or inverted trapezoids or the like.

In an exemplary implementation mode, the pixel definition thin film within the light transmitting opening TV2 is removed to form the light transmitting region 120. A side of the light transmitting opening TV2 close to the display region 110 may be provided with a shielding groove, and the second electrode plate via YV and the sub-connection electrode 61-3 may be disposed within the shielding groove, so that the pixel definition layer may shield the second electrode plate via YV and the sub-connection electrode 61-3.

In an exemplary implementation mode, an orthographic projection of the second electrode plate via YV on the base substrate is not overlapped with an orthographic projection of the light transmitting opening TV2 on the base substrate.

In an exemplary implementation mode, orthographic projections of the multiple third auxiliary electrodes 37 on the base substrate are within a range of an orthographic projection of the light transmitting opening TV2 on the base substrate.

In an exemplary implementation mode, the pixel definition layer may be made of polyimide, acrylic, or polyethylene terephthalate, etc.

(9) Forming patterns of an organic emitting layer and a third electrode. In an exemplary implementation mode, forming the patterns of the organic emitting layer and the third electrode may include: first forming a pattern of an organic emitting layer in the display region 110, wherein the organic emitting layer is connected with the third sub-electrode and the fourth sub-electrode through the first pixel opening K1 and the second pixel opening K2, respectively; and then forming a third electrode, wherein the third electrode is connected with the organic emitting layer in the display region 110, and is connected with the third auxiliary electrode through an auxiliary electrode opening K3 in the light transmitting region 120. Since the third auxiliary electrode is connected with the second power supply line, a connection between the third electrode and the second power supply line is achieved. In an exemplary implementation mode, the third electrode may be a cathode of the light emitting device.

In an exemplary implementation mode, the organic emitting layer may include an Emitting Layer (EML) and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, the organic emitting layer may be formed by evaporation using a Fine Metal Mask (FMM) or an Open Mask, or forming using an inkjet process.

In an exemplary implementation mode, the preparation process of the display substrate may further include: forming a pattern of an encapsulation structure layer. Forming the pattern of the encapsulation structure layer may include: first depositing a first inorganic thin film using an open mask plate to form a first encapsulation layer, then, inkjet printing an organic material on the first encapsulation layer using an inkjet printing process to form a second encapsulation layer after curing, and then depositing a second inorganic thin film using an open mask plate to form a third encapsulation layer, wherein the first encapsulation layer, the second encapsulation layer, and the third encapsulation layer form an encapsulation structure layer. The first encapsulation layer and the third encapsulation layer may be made of any one or more of Silicon Oxide (SiOx), Silicon Nitride (SiNx), Silicon Carbide (SiC), Silicon Carbonitride (SiCN), and Silicon Oxynitride (SiON), and each may be a single layer, a multi-layer, or a composite layer. The second encapsulation layer may be made of a resin material, thereby forming a stacked structure of an inorganic material/an organic material/an inorganic material, wherein an organic material layer is disposed between two inorganic material layers, thus ensuring that external water vapor cannot enter the light emitting structure layer.

In an exemplary implementation mode, the preparation process of the display substrate may further include: forming a film layer, such as a color film layer and a black matrix, wherein the black matrix has multiple opening regions arranged in a matrix, and the color film layer is filled within the opening regions, which is not limited here in the present disclosure.

So far, preparation of the display substrate according to the exemplary embodiment of the present disclosure is completed.

In an exemplary implementation mode, the base substrate may be a flexible base substrate, or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. In an exemplary implementation mode, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (P1), Polyethylene Terephthalate (PET), or a surface-treated polymer soft film, or the like, materials of the first inorganic material layer and the second inorganic material layer may be Silicon Nitride (SiNx) or Silicon Oxide (SiOx), or the like, for improving a water and oxygen resistance capability of the base substrate, and a material of the semiconductor layer may be amorphous silicon (a-si).

In an exemplary implementation mode, the first conductive layer and the second conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, and the third insulation layer may be made of any one or more of Silicon Oxide (SiOx), Silicon Nitride (SiNx), and Silicon Oxynitride (SiON), and may be a single layer, a multi-layer, or a composite layer. The planarization layer may be made of an organic material such as resin.

As may be seen from a structure and a preparation flow of the display substrate described above, according to the display substrate provided by the embodiment of the present disclosure, through the optimized design of deployment and layout, the electrode plate connection electrode is utilized to be respectively connected with the first electrode and the first electrode plate, and the second electrode plate via is disposed on a side of the first electrode plate via close to the light transmitting region, thus achieving matching of a high aperture ratio and a high transmittance. According to the embodiment of the present disclosure, the first electrode plate of the storage capacitor is disposed on the first conductive layer, the electrode plate connection electrode is disposed on the second conductive layer, a first electrode of the light emitting device is disposed on the third conductive layer, the electrode plate connection electrode is connected with the first electrode plate through the first electrode plate via, and the first electrode is connected with the electrode plate connection electrode through the second electrode plate via, thus achieving a connection between the light emitting device and the pixel drive circuit. According to the embodiment of the present disclosure, the first electrode via is disposed on a side of the first power supply line or the second power supply line away from the light transmitting region, and the second electrode via is disposed on a side of the first power supply line or the second power supply line close to the light transmitting region, so that the second electrode via does not affect an arrangement of the first electrode or flatness of the first electrode, and areas of the first electrode and a pixel opening are increased, thereby effectively improving a pixel opening ratio of the display region. According to the embodiment of the present disclosure, the second electrode plate via is disposed on a side of the first power supply line or the second power supply line close to the light transmitting region, and the light transmitting region is changed into an irregular shape by using the electrode plate connection electrode and the second electrode plate via, thereby reducing a diffraction effect of the light transmitting region and effectively improving a transmittance of the light transmitting region.

According to the embodiment of the present disclosure, structures such as the first power supply line, the data signal line, and the compensation signal line are disposed on the first conductive layer, and structures such as the scan signal line are disposed on the second conductive layer, which not only reduces one conductive layer, but also reduces a patterning process of a transfer via and a patterning process of a transfer conductive layer, so that the preparation process of the display substrate only needs eight times of patterning processes, thereby reducing times of patterning processes, effectively improving a production efficiency, effectively reducing a production cost, and maximizing a product yield.

According to the embodiment of the present disclosure, a 3T1C pixel drive circuit with one scan signal line is adopted, and one scan signal line is connected with a first transistor and a third transistor in the pixel drive circuit. By reducing a quantity of scan signal lines, not only a structure of the pixel drive circuit may be simplified, an occupied area of the pixel drive circuit may be reduced, and it is beneficial to achieve high-resolution display, but also quantities of corresponding gate drive circuits (GOA) and clock signal lines (CLK) may be reduced exponentially, thereby effectively reducing occupied areas of the gate drive circuits and the clock signal lines, which is beneficial to achieve a narrow frame and improve a product advantage.

According to the embodiment of the present disclosure, longitudinal wiring is adopted for the first conductive layer, transverse wiring is adopted for the second conductive layer, a single-line structure is disposed in the light transmitting region, and a double-line structure is disposed in the display region, which may not only ensure that the scan signal line drives all pixel drive circuits in a repetition region, but also achieve a dual-channel function, thus signal lines at all positions may be repaired, maintenance for full-signal short-circuit defects is achieved, and a product yield is effectively improved.

According to the exemplary embodiment of the present disclosure, by disposing a one-drag-four structure of the first power supply line and a one-drag-four structure of the compensation signal line, a quantity of signal lines is saved, occupied space is saved, a structure is simple, a layout is reasonable, layout space is fully utilized, and a space utilization rate is improved, and it is beneficial to improve a resolution.

According to the exemplary embodiment of the present disclosure, by adopting a first power supply line structure of a non-mesh structure, a pixel opening ratio may be effectively increased and a display effect may be improved.

According to the embodiment of the present disclosure, two sub-electrodes are disposed in one sub-pixel and the two sub-electrodes are connected through a sub-connection electrode, which may not only improve a success rate of repairing a bright spot defect and avoid an influence of repairing on a pixel drive circuit, avoid other defects, and have a high success rate of repairing, but also may ensure flatness of a first electrode, improve light output quality of a light emitting device, and improve a display effect.

According to the embodiment of the disclosure, a second power supply line and an auxiliary electrode are disposed, and the second power supply line is connected with a third electrode of a light emitting device through the auxiliary electrode, which may effectively reduce voltage drop of a power supply signal and ensure uniformity of display.

The preparation process according to the exemplary embodiment of the present disclosure may be compatible well with an existing preparation process, and the process is simple to achieve and is easy to implement, and has a high production efficiency, a low production cost, and a high yield.

The structure shown and mentioned above in the present disclosure and the preparation process thereof are merely exemplary descriptions. In an exemplary implementation mode, a corresponding structure may be altered and patterning processes may be added or reduced according to actual needs. For example, two times of patterning processes may be adopted for forming the patterns of the third insulation layer and the planarization layer, so that the preparation process of the display substrate requires nine times of patterning processes, which is not limited here in the present disclosure.

In an exemplary implementation mode, the display substrate according to the present disclosure may be applied to a display apparatus with a pixel drive circuit, such as an OLED, a quantum dot display (QLED), a light emitting diode display (Micro LED or Mini LED), or a Quantum Dot Light Emitting Diode display (QDLED), which is not limited here in the present disclosure.

The present disclosure also provides a preparation method of a display substrate, for preparing the display substrate according to the foregoing embodiments. In an exemplary implementation mode, the display substrate includes multiple repetition units, at least one repetition unit includes a display region and a light transmitting region located on at least one side of the display region, the display region is configured to perform image display, and the light transmitting region is configured to transmit light, the display region includes multiple sub-pixels, at least one sub-pixel includes a pixel drive circuit and a light emitting device, the pixel drive circuit at least includes a storage capacitor, the storage capacitor at least includes a first electrode plate, the light emitting device at least includes a first electrode, the first electrode is connected with the first electrode plate through an electrode plate connection electrode; the preparation method may include: forming multiple conductive layers on a base substrate, wherein the first electrode plate, the electrode plate connection electrode, and the first electrode are disposed in different conductive layers, the first electrode plate is connected with the electrode plate connection electrode through a first electrode plate via, the first electrode is connected with the electrode plate connection electrode through a second electrode plate via, and in at least one sub-pixel, the second electrode plate via is disposed on a side of the first electrode plate via close to the light transmitting region.

The present disclosure also provides a display apparatus including the aforementioned display substrate. The display apparatus may be any product or component with a display function, such as a mobile phone, a tablet computer, a television, a display, a laptop computer, a digital photo frame, or a navigator, which is not limited in the embodiments of the present disclosure.

Although implementation modes disclosed in the present disclosure are as above, it should be noted that the above implementation modes are exemplary only and not restrictive. Therefore, the present disclosure is not limited to contents specifically shown and described herein. Various modifications, substitutions, or omissions may be made to a form and details of implementation without departing from the scope of the present disclosure.

The invention claimed is:

1. A display substrate, comprising multiple repetition units, wherein at least one repetition unit comprises a display region and a light transmitting region located on at least one side of the display region, the display region is configured to perform image display, and the light transmitting region is configured to transmit light; the display region comprises multiple sub-pixels, at least one sub-pixel comprises a pixel drive circuit and a light emitting device, the pixel drive circuit at least comprises a storage capacitor, the storage capacitor at least comprises a first electrode plate, the light emitting device at least comprises a first electrode, and the first electrode is connected with the first electrode plate through an electrode plate connection electrode; in a direction perpendicular to the display substrate, the display substrate at least comprises multiple conductive layers disposed on a base substrate, the first electrode plate, the electrode plate connection electrode, and the first electrode are disposed in different conductive layers, the first electrode plate is connected with the electrode plate connection electrode through a first electrode plate via, the first electrode is connected with the electrode plate connection electrode through a second electrode plate via, and in at least one sub-pixel, the second electrode plate via is disposed on a side of the first electrode plate via close to the light transmitting region.

2. The display substrate according to claim 1, wherein the display region further comprises a first power supply line, the first power supply line is configured to supply a first power supply signal to the pixel drive circuit, and the first power supply line is disposed on a side of the display region close to the light transmitting region; the first electrode plate via is disposed on a side of the first power supply line away from the light transmitting region, the second electrode plate via is disposed on a side of the first power supply line close to the light transmitting region, and an orthographic projection of the electrode plate connection electrode on the base substrate is at least partially overlapped with an orthographic projection of the first power supply line on the base substrate.

3. The display substrate according to claim 1, wherein the display region further comprises a second power supply line, the second power supply line is configured to supply a second power supply signal to the light emitting device, and the second power supply line is disposed on a side of the display region close to the light transmitting region; the first electrode plate via is disposed on a side of the second power supply line away from the light transmitting region, the second electrode plate via is disposed on a side of the second power supply line close to the light transmitting region, and an orthographic projection of the electrode plate connection electrode on the base substrate is at least partially overlapped with an orthographic projection of the second power supply line on the base substrate.

4. The display substrate according to claim 3, wherein the light transmitting region further comprises at least one first auxiliary electrode and at least one second auxiliary electrode, the second auxiliary electrode is connected with the first auxiliary electrode through an auxiliary electrode via, and the first auxiliary electrode is connected with the second power supply line; there is a first distance between an edge of the second electrode plate via away from the second power supply line and an edge of the second power supply line close to the second electrode plate via, and there is a second distance between an edge of at least one auxiliary electrode via away from the second power supply line and an edge of the second power supply line close to the auxiliary electrode via, and the first distance is smaller than the second distance.

5. The display substrate according to claim 4, wherein an area of an orthographic projection of the auxiliary electrode via on the base substrate is larger than an area of an orthographic projection of the second electrode plate via on the base substrate.

6. The display substrate according to claim 1, wherein an area of an orthographic projection of the second electrode plate via on the base substrate is larger than an area of an orthographic projection of the first electrode plate via on the base substrate.

7. The display substrate according to claim 1, wherein the multiple conductive layers at least comprise a first conductive layer disposed on the base substrate, a second conductive layer disposed on a side of the first conductive layer away from the base substrate, and a third conductive layer disposed on a side of the second conductive layer away from the base substrate, the first electrode plate is disposed in the first conductive layer, the electrode plate connection electrode is disposed in the second conductive layer, and the first electrode is disposed in the third conductive layer.

8. The display substrate according to claim 7, wherein the display substrate further comprises a first insulation layer, a second insulation layer, and a third insulation layer, the first insulation layer is disposed on a side of the first conductive layer away from the base substrate, the second insulation layer is disposed on a side of the first insulation layer away from the base substrate, and the second conductive layer is disposed on a side of the second insulation layer away from the base substrate, the third insulation layer is disposed on a side of the second conductive layer away from the base substrate, and the third conductive layer is disposed on a side of the third insulation layer away from the base substrate; the first electrode plate via is disposed in the first insulation layer and the second insulation layer, and the second electrode plate via is disposed in the third insulation layer.

9. The display substrate according to claim 1, wherein in at least one sub-pixel, the storage capacitor further comprises a second electrode plate, an orthographic projection of the second electrode plate on the base substrate is at least partially overlapped with an orthographic projection of the first electrode plate on the base substrate, and the second electrode plate is disposed in a same layer as the electrode plate connection electrode.

10. The display substrate according to claim 9, wherein in at least one sub-pixel, an electrode plate groove is disposed on the second electrode plate, and an orthographic projection of the first electrode plate via on the base substrate is within a range of an orthographic projection of the electrode plate groove on the base substrate.

11. The display substrate according to claim 1, wherein in at least one sub-pixel, the electrode plate connection electrode at least comprises a first sub-connection electrode and a second sub-connection electrode, a first end of the first sub-connection electrode is connected with the first electrode plate through the first electrode plate via, a second end of the first sub-connection electrode is connected with the second sub-connection electrode after extending toward a direction close to the light transmitting region, and the first electrode is connected with the second sub-connection electrode through the second electrode plate via.

12. The display substrate according to claim 11, wherein in at least one sub-pixel, the first sub-connection electrode and the second sub-connection electrode are disposed in a same layer and are of an interconnected integral structure.

13. The display substrate according to claim 1, wherein in at least one sub-pixel, the first electrode at least comprises a first sub-electrode, a second sub-electrode, and a sub-connection electrode, the first sub-electrode and the second sub-electrode are disposed in isolation, the sub-connection electrode has a "C" shape, a first end of the sub-connection electrode is connected with the first sub-electrode, a second end of the sub-connection electrode is connected with the second sub-electrode, and a region between the first end and the second end is connected with the electrode plate connection electrode through the second electrode plate via.

14. The display substrate according to claim 13, wherein in at least one sub-pixel, the first sub-electrode, the second sub-electrode, and the sub-connection electrode are disposed in a same layer and are of an interconnected integral structure.

15. The display substrate according to claim 13, wherein in at least one sub-pixel, an orthographic projection of the first sub-electrode on the base substrate is not overlapped with an orthographic projection of the first electrode plate via on the base substrate, and an orthographic projection of the second sub-electrode on the base substrate is not overlapped with the orthographic projection of the first electrode plate via on the base substrate.

16. The display substrate according to claim 13, wherein in at least one sub-pixel, the display region further comprises a second electrode disposed on a side of the first electrode away from the base substrate, the second electrode comprises a third sub-electrode and a fourth sub-electrode disposed in isolation, an orthographic projection of the third sub-electrode on the base substrate is at least partially overlapped with an orthographic projection of the first sub-electrode on the base substrate, the third sub-electrode is lapped with the first sub-electrode, an orthographic projection of the fourth sub-electrode on the base substrate is at least partially overlapped with an orthographic projection of the second sub-electrode on the base substrate, the fourth sub-electrode is lapped with the second sub-electrode, the orthographic projection of the third sub-electrode on the base substrate is not overlapped with the orthographic projection of the first electrode plate via on the base substrate, and the orthographic projection of the fourth sub-electrode on the base substrate is not overlapped with the orthographic projection of the first electrode plate via on the base substrate.

17. The display substrate according to claim 16, wherein the display substrate further comprises a pixel definition layer disposed on a side of the second electrode away from the base substrate, in at least one sub-pixel, the pixel definition layer is provided with a first pixel opening and a second pixel opening, the first pixel opening exposes the third sub-electrode, the second pixel opening exposes the fourth sub-electrode, an orthographic projection of the first pixel opening on the base substrate is not overlapped with the orthographic projection of the first electrode plate via on the base substrate, and an orthographic projection of the second pixel opening on the base substrate is not overlapped with the orthographic projection of the first electrode plate via on the base substrate.

18. The display substrate according to claim 17, wherein in the light transmitting region, a light transmitting opening is disposed on the pixel definition layer, and an orthographic projection of the light transmitting opening on the base substrate is not overlapped with an orthographic projection of the second electrode plate via on the base substrate.

19. A display apparatus, comprising a display substrate according to claim 1.

20. A preparation method of a display substrate, wherein the display substrate comprises multiple repetition units, at least one repetition unit comprises a display region and a light transmitting region located on at least one side of the display region, the display region is configured to perform image display, and the light transmitting region is configured to transmit light, the display region comprises multiple sub-pixels, at least one sub-pixel comprises a pixel drive circuit and a light emitting device, the pixel drive circuit at least comprises a storage capacitor, the storage capacitor at least comprises a first electrode plate, the light emitting device at least comprises a first electrode, and the first electrode is connected with the first electrode plate through an electrode plate connection electrode; the preparation method comprising:

forming multiple conductive layers on a base substrate, wherein the first electrode plate, the electrode plate connection electrode, and the first electrode are disposed in different conductive layers, the first electrode plate is connected with the electrode plate connection electrode through a first electrode plate via, the first electrode is connected with the electrode plate connection electrode through a second electrode plate via, and in at least one sub-pixel, the second electrode plate via is disposed on a side of the first electrode plate via close to the light transmitting region.

* * * * *